United States Patent
Fukui et al.

(10) Patent No.: US 11,981,814 B2
(45) Date of Patent: May 14, 2024

(54) CURED SILICONE ELASTOMER HAVING RADICAL REACTIVITY AND USE OF SAME

(71) Applicant: DOW TORAY CO., LTD., Tokyo (JP)

(72) Inventors: Hiroshi Fukui, Ichihara (JP); Kyoko Toyama, Ichihara (JP); Masayasu Akasaka, Ichihara (JP)

(73) Assignee: DOW TORAY CO., LTD., Tokyo (JP)

(*) Notice: Subject to any disclaimer, the term of this patent is extended or adjusted under 35 U.S.C. 154(b) by 563 days.

(21) Appl. No.: 16/645,912

(22) PCT Filed: Sep. 6, 2018

(86) PCT No.: PCT/JP2018/033098
§ 371 (c)(1),
(2) Date: Mar. 10, 2020

(87) PCT Pub. No.: WO2019/049950
PCT Pub. Date: Mar. 14, 2019

(65) Prior Publication Data
US 2020/0277492 A1  Sep. 3, 2020

(30) Foreign Application Priority Data
Sep. 11, 2017 (JP) ................. 2017-173713

(51) Int. Cl.
*C08L 83/04* (2006.01)
*B32B 7/06* (2019.01)
(Continued)

(52) U.S. Cl.
CPC ............... *C08L 83/04* (2013.01); *B32B 7/06* (2013.01); *B32B 7/12* (2013.01); *B32B 27/283* (2013.01);
(Continued)

(58) Field of Classification Search
CPC ............... C08L 83/04; C08L 2205/025; C08L 2205/035; B32B 7/06; B32B 7/12;
(Continued)

(56) References Cited

U.S. PATENT DOCUMENTS

| 2006/0276584 A1 | 12/2006 | Todoroki et al. |
| 2009/0253846 A1 | 10/2009 | Fukui |

(Continued)

FOREIGN PATENT DOCUMENTS

| EP | 3517292 A1 | 7/2019 |
| EP | 3517577 A1 | 7/2019 |

(Continued)

OTHER PUBLICATIONS

Machine translation of JP 2007/191629 retrieved Sep. 19, 2022.*

(Continued)

*Primary Examiner* — Michael B Nelson
(74) *Attorney, Agent, or Firm* — WARNER NORCROSS + JUDD LLP

(57) ABSTRACT

A silicone elastomer cured product having radical reactivity obtained by curing a composition is disclosed. The composition comprises (A) a chain organopolysiloxane having a curing reactive group, and optionally (B) an organohydrogen polysiloxane, (C1) a curing agent, and (D) an organopolysiloxane resin. The surface of the cured product has radical reactivity with, for example, an adhesive, and is easily removable along with, for example, adhesive tape after use as a protective material. In general, the cured product has excellent heat resistance and flexibility and exhibits good adhesion and conformity to a substrate so as not to separate from a substrate even when the cured product is cut together with the substrate while remaining easily (Continued)

removable from the substrate when desired. A protective material for an electronic component made of the cured product is also disclosed.

18 Claims, 2 Drawing Sheets

(51) Int. Cl.
  *B32B 7/12* (2006.01)
  *B32B 27/28* (2006.01)
  *B32B 37/12* (2006.01)
  *B32B 37/18* (2006.01)
  *B32B 38/10* (2006.01)
  *C08J 5/18* (2006.01)
  *C09J 7/29* (2018.01)

(52) U.S. Cl.
  CPC ............ *B32B 37/12* (2013.01); *B32B 37/182* (2013.01); *B32B 38/10* (2013.01); *C08J 5/18* (2013.01); *C09J 7/29* (2018.01); *B32B 2457/00* (2013.01); *C08J 2383/04* (2013.01); *C08L 2205/025* (2013.01); *C08L 2205/035* (2013.01); *C09J 2483/00* (2013.01)

(58) Field of Classification Search
  CPC ..... B32B 27/283; B32B 37/12; B32B 37/182; B32B 38/10; B32B 2457/00; B32B 27/00; B32B 27/26; C08J 5/18; C08J 2383/04; C09J 7/29; C09J 2483/00; C09J 7/38; C09J 7/25; C09J 183/04; C08G 77/12; C08G 77/20; C08F 299/08; H01L 21/52; C08K 5/0025; C08K 5/14; C08K 5/5415
  See application file for complete search history.

(56) References Cited

U.S. PATENT DOCUMENTS

| 2011/0306746 | A1 | 12/2011 | Tanaka et al. |
| 2017/0002159 | A1 | 1/2017 | Ahn et al. |
| 2017/0121462 | A1 | 5/2017 | Fujisawa et al. |
| 2017/0355804 | A1* | 12/2017 | Fujisawa .................. C08K 5/14 |

FOREIGN PATENT DOCUMENTS

| JP | S59204259 A | 11/1984 |
| JP | S61048945 A | 3/1986 |
| JP | S62104145 A | 5/1987 |
| JP | 2003213132 A | 7/2003 |
| JP | 2006274154 A | 10/2006 |
| JP | 2006274154 A | 10/2006 |
| JP | 2006335926 A | 12/2006 |
| JP | 2006335926 A | 12/2006 |
| JP | 2007191629 A | 8/2007 |
| JP | 2007/191629 | * 12/2007 |
| JP | 2011153249 A | 8/2011 |
| JP | 2012017458 A | 1/2012 |
| JP | 2012017458 A | 1/2012 |
| JP | 2015129213 A | 7/2015 |
| JP | 2015199851 A | 11/2015 |
| JP | 2016124967 A | 7/2016 |
| JP | 2017508852 A | 3/2017 |
| JP | 2017508852 A | 3/2017 |
| KR | 20070036090 | 4/2007 |
| WO | 2006007268 A1 | 1/2006 |
| WO | 2015155950 A1 | 10/2015 |
| WO | WO2015155950 A1 | 10/2015 |
| WO | 2016103654 A1 | 6/2016 |
| WO | 2018056297 A1 | 3/2018 |
| WO | WO2018056297 A1 | 3/2018 |

OTHER PUBLICATIONS

English translation of International Search Report for PCT/JP2018/033098 dated Oct. 30, 2018, 2 pages.
Machine assisted English translation of JPS59204259A obtained from https://worldwide.espacenet.com on Mar. 9, 2020, 5 pages.
Machine assisted English translation of JPS6148945A obtained from https://worldwide.espacenet.com on Mar. 9, 2020, 5 pages.
Machine assisted English translation of JPS62104145A obtained from https://worldwide.espacenet.com on Mar. 9, 2020, 6 pages.
Machine assisted English translation of JPS62104145A obtained from https://patents.google.com/patent on Mar. 9, 2020, 10 pages.
Machine assisted English translation of JP2007191629A obtained from https://patents.google.com/patent on Mar. 9, 2020, 12 pages.
Machine assisted English translation of JP2011153249A obtained from https://patents.google.com/patent on Mar. 9, 2020, 14 pages.
Machine assisted English translation of JP2015129213A obtained from https://patents.google.com/patent on Mar. 9, 2020, 11 pages.
Machine assisted English translation of JP2015199851A obtained from https://patents.google.com/patent on Mar. 9, 2020, 13 pages.
Machine assisted English translation of JP2016124967A obtained from https://patents.google.com/patent on Mar. 9, 2020, 22 pages.

* cited by examiner

[FIG. 1]
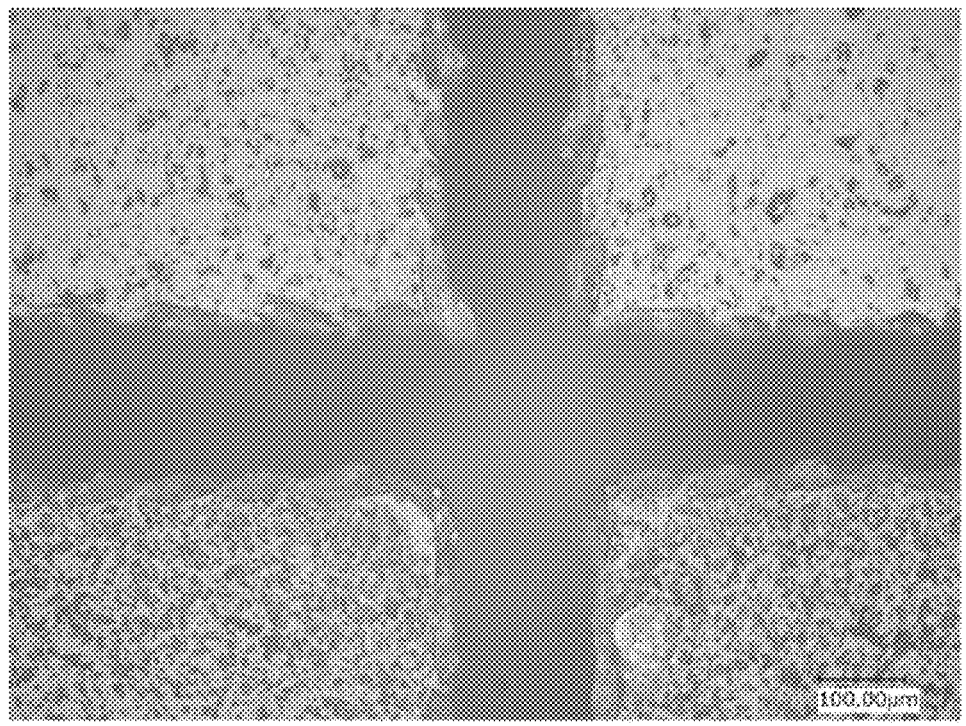
[FIG. 2]
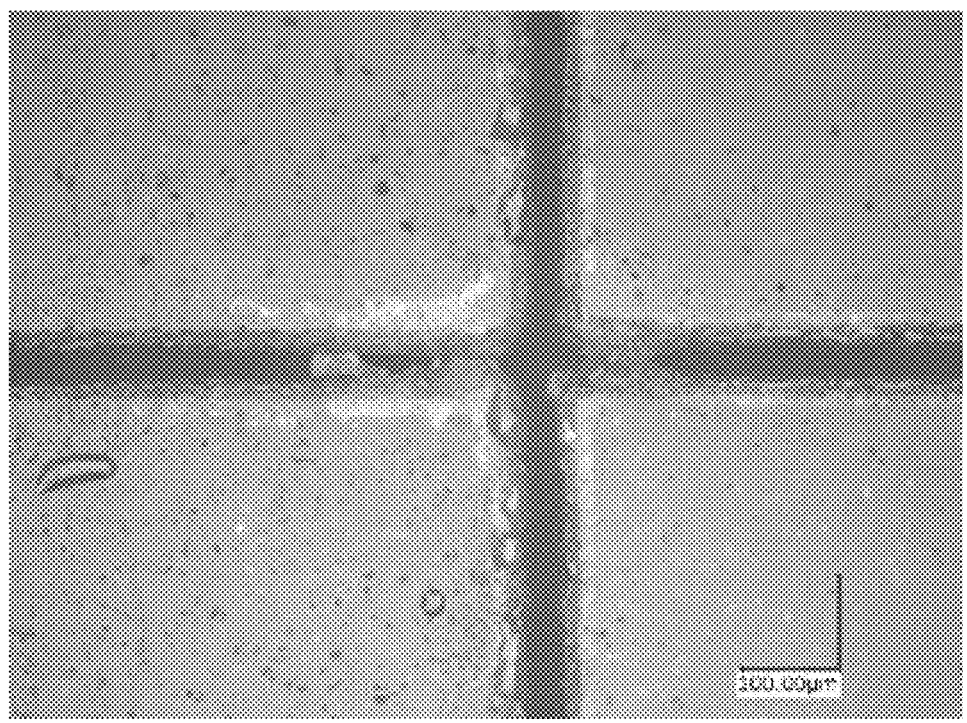

[FIG. 3]
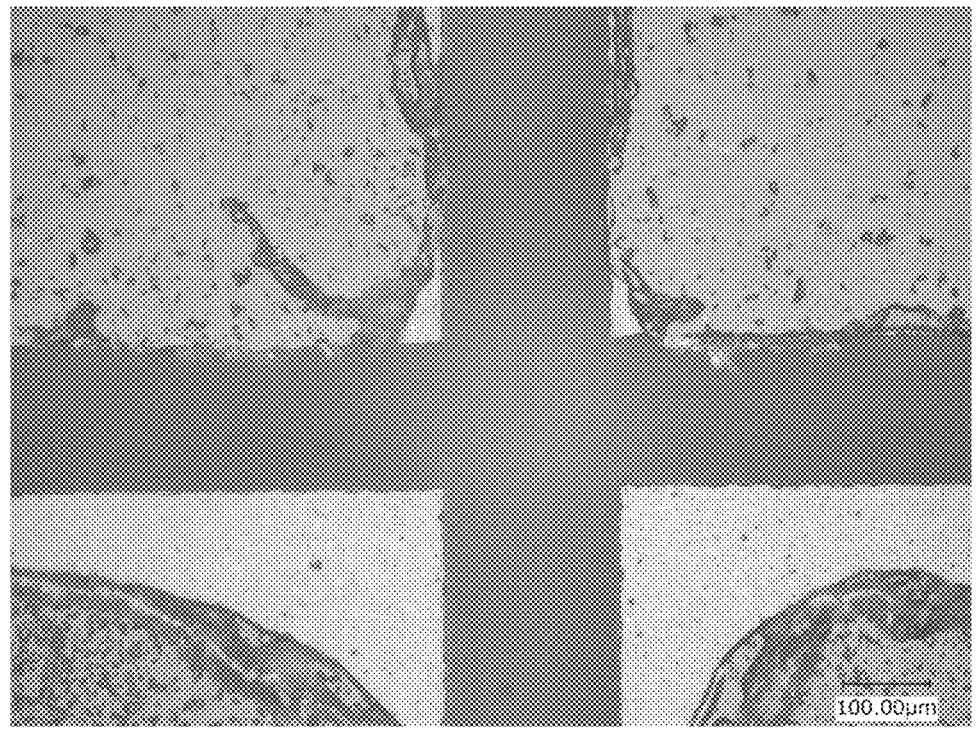
[FIG. 4]

CURED SILICONE ELASTOMER HAVING RADICAL REACTIVITY AND USE OF SAME

CROSS-REFERENCE TO RELATED APPLICATIONS

This application is the National Stage of International Appl. No. PCT/JP2018/033098 filed on 6 Sep. 2018, which claims priority to and all advantages of Japanese Appl. No. 2017- 173713 filed on 11 Sep. 2017, the content of which is hereby incorporated by reference.

TECHNICAL FIELD

The present invention relates to a silicone elastomer cured product that has excellent adhesion and conformability to a substrate, that can be used as a protective material with respect to various types of chemical and physical treatments, and that has radical reactivity on the surface with an adhesive or pressure-sensitive adhesive, and relates to a laminate having this cured product, a use for this cured product and laminate in the manufacture of electronic components, and a method for manufacturing electronic components using this cured product.

BACKGROUND ART

Silicone gels can be obtained by subjecting an organopolysiloxane having a reactive functional group to a curing reaction so as to have a low cross-linking density. Because these silicone gels have excellent heat resistance, weather resistance, oil resistance, cold resistance, and electrical insulating properties, and have a low elastic modulus, low stress and excellent stress buffering due to being a gel, unlike ordinary elastic products, they are widely used as damping materials in optical applications and as protective materials for automotive electronic components and consumer electronic components (see, for example, Patent Documents 1-7). Because silicone gels are soft and flexible, they readily conform to uneven substrate surfaces, conforming closely to substrates that are not flat without leaving gaps or spaces.

However, because they are "gel-like," these silicone gels are weak and are easily deformed and disrupted by external stress due to vibrations and internal stress due to expansion and contraction along with temperature changes. When these gels have to be separated or cut (using, for example, a dicing operation) from electronic components that require protection, adhesion or stress buffering, some of the gel remains attached to the component, and the residual gel on the substrate cannot be easily removed from the substrate or electronic component. This residual gel may cause defects in electronic components, impede mounting on a semiconductor, and cause malfunctions.

In the fields of adhesive films and semiconductor sealing agents, curable compositions have been proposed in which the curing reaction is conducted in multiple stages under different curing reaction conditions. For example, Patent Document 8 has disclosed a thermosetting composition used in an adhesive sheet for dicing and die bonding which is cured using a two-stage curing reaction. The curing in the first stage produces a pressure-sensitive adhesiveness required in the dicing process and the curing in the second stage produces strong adhesiveness. The present applicant has proposed a curable silicone composition in Patent Document 9 which has excellent initial curability and maintains high physical strength at high temperatures above 250° C.

However, because the silicone cured product with multiple-stage curability adheres strongly to the substrate after the two-stage curing reaction, adhesive residue remains on the substrate and the silicone cured product can be difficult to remove from the substrate or electronic component. Also, because the silicone cured product does not have sufficient flexibility and conformability, adhesive residue peels off at the edges and attaches to the substrate (including uneven residual adhesive) when an electronic component including this silicone cured product is cut (using, for example, a dicing operation). As a result, it often does not function adequately as a protective material on a substrate surface.

Therefore, there is strong demand for a protective material made of a silicone elastomer cured product that is flexible and has excellent stress buffering properties, conformability, and adhesion to substrates, that has greater physical strength than silicone gels, and that can be easily removed from a substrate when desired. There is also strong demand for methods of using such a material.

PRIOR ART DOCUMENTS

Patent Documents

Patent Document 1: JP S59-204259 A
Patent Document 2: JP S61-048945 A
Patent Document 3: JP S62-104145 A
Patent Document 4: JP 2003-213132 A (JP 3865638 B2)
Patent Document 5: JP 2012-017458 A (JP 5594232 B2)
Patent Document 6: WO 2015/155950 A1 (JP 5794229 B2)
Patent Document 7: JP 2011-153249 A
Patent Document 8: JP 2007-191629 A (JP 4628270 B2)
Patent Document 9: JP 2016-124967 A

SUMMARY OF THE INVENTION

Problem to be Solved by the Invention

An object of the present invention is to solve this problem by providing a silicone elastomer cured product having excellent heat resistance and physical strength, and exhibiting a low modulus of elasticity, low stress, good stress buffering and flexibility, and good adhesion and conformity to a substrate so as not to separate from a substrate even when the cured product is cut together with the substrate while remaining easily removable from the substrate when desired, to provide a protective material for an electronic component made of this cured product, and to provide a use of this cured product. It is another object of the present invention to provide an application for this silicone elastomer cured product, a method for manufacturing an electronic component using this silicone elastomer cured product, and a member for manufacturing an electronic component.

Means for Solving the Problem

As a result of extensive research, the present inventors discovered that the problem described above could be solved by a silicone elastomer cured product having radical reactivity obtained by curing a composition comprising the following component:
(A) a chain organopolysiloxane having at least two curing reactive groups in the molecule, and optionally
(B) an organohydrogenpolysiloxane,
(C1) a curing agent for component (A) and component (B) above, and (D) an organopolysiloxane resin in an amount of 10 to 1000 parts by mass per 100 parts by mass component (A), and by having an unreacted (C2) radical initiator in the cured product or on the surface of the cured product. The present invention is a product of this discovery. Because the surface of this silicone elastomer cured product has radical reactivity with an adhesive or pressure-sensitive adhesive, the silicone elastomer cured product can be integrated with the adhesive or pressure-sensitive adhesive, for example, at any point in the production process for an electronic component, by bringing the cured product into contact with a sheet-like member having an adhesive or pressure-sensitive adhesive layer such as adhesive tape or pressure-sensitive adhesive tape and applying heat or ultraviolet light, allowing the integrated unit to be easily released. The radical initiator is preferably present in the silicone elastomer cured product in an unreacted state by combining the initiator with a curable silicone composition prior to curing and by setting the curing conditions at, for example, a low temperature. However, some or all of the initiator may be applied to the surface of the silicone elastomer cured product after curing using a sprayer. However, unlike combining the initiator with a curable silicone composition prior to curing, this process requires an additional application step.

The present inventors also discovered that they could solve the problem described above by providing a laminate containing this silicone elastomer cured product, a protective member for electronic components consisting of this silicone elastomer cured product, a use in the manufacture of these electronic components, and a method for manufacturing an electronic component using this silicone elastomer cured product. The present invention is a product of this discovery.

More specifically, the object of the present invention is achieved by the following silicone elastomer cured product.

[1] A silicone elastomer cured product having radical reactivity obtained by curing a composition comprising the following component:
(A) a chain organopolysiloxane having at least two curing reactive groups in the molecule, and optionally
(B) an organohydrogenpolysiloxane,
(C1) a curing agent for component (A) and component (B) above, and
(D) an organopolysiloxane resin in an amount of 10 to 1000 parts by mass per 100 parts by mass component (A), and by having an unreacted (C2) radical initiator in the cured product or on the surface of the cured product.

[2] A silicone elastomer cured product according to [1], wherein the surface of the silicone elastomer cured product has radical reactivity with an adhesive or pressure-sensitive adhesive, and the cured product has a loss factor tan δ in a range from 0.01 to 1.00 and a storage modulus G' in a range from $4.0 \times 10^4$ to $5.0 \times 10^6$ Pa at a temperature from 23° C. to 100° C.

[3] A silicone elastomer cured product according to [1] or [2], wherein component (C1) is one or more type of curing agent selected from among hydrosilylation reaction catalysts and condensation catalysts, and component (C2) is a radical initiator containing an organic peroxide.

[4] A silicone elastomer cured product according to any one of [1] to [3], wherein component (A) is (A1) a linear or branched organopolysiloxane having at least two alkenyl groups in the molecule,
component (B) is an organohydrogenpolysiloxane having at least two silicon-bonded hydrogen atoms in the molecule, component (C1) is a curing reaction catalyst containing a hydrosilylation reaction catalyst, component (C2) is an alkyl peroxide,
component (D) is (D1) a resinous or reticulated organopolysiloxane resin comprising any combination of triorganosiloxy units (M units), diorganosiloxy units (D units), monoorganosiloxy units (T units), and siloxy units (Q units), and
the amount of silicon-bonded hydrogen atoms in component (B) is in a range of 0.5 mol or higher per mol of alkenyl groups in component (A).

[5] A silicone elastomer cured product according to any one of [1] to [4], wherein component (D1) is an organopolysiloxane resin comprising a combination of M units and Q units, the molar ratio of M units to Q units being in a range from 0.5 to 1.2.

[6] A silicone elastomer cured product according to any one of [1] to [5], wherein each of components (A) to (D) is cured at a temperature at which component (C2) does not react.

[7] A silicone elastomer cured product according to [6], wherein component (C2) is an alkyl peroxide and the temperature for curing is 100° C. or less.

[8] A silicone elastomer cured product according to any one of [1] to [7], wherein the silicone elastomer cured product has radical reactivity with another adhesive or pressure-sensitive adhesive.

[9] A silicone elastomer cured product according to any one of [1] to [8], wherein the silicone elastomer cured product is in the form of a film or sheet having an average thickness in a range from 5 to 500 μm.

The object of the present invention is also achieved using a silicone elastomer cured product in the following aspect.

[10] A laminate comprising a silicone elastomer cured product according to any one of [1] to [9].

[11] A laminate comprising a substrate, a silicone elastomer cured product according to any one of [1] to [9], and an adhesive layer or pressure-sensitive adhesive layer, and having a structure in which the layer comprising the silicone elastomer cured product faces the adhesive layer or pressure-sensitive adhesive layer.

[12] A laminate comprising a release agent layer facing the surface of at least one of a silicone elastomer cured product according to any one of [1] to [9] and a layer composed of the silicone elastomer cured product.

[13] A protective material for an electronic component comprising a silicone elastomer cured product according to any one of [1] to [9].

[14] A laminate according to any one of [10] to [12] used in the manufacture of an electronic component.

Similarly, the object of the present invention is achieved by the following method for manufacturing an electronic component and a member for manufacturing an electronic component.

[15] A method for manufacturing an electronic component comprising: conducting a radical reaction on the silicone elastomer cured product and adhesive layer or pressure-sensitive adhesive layer in a laminate composed of
(L1) a substrate,
(L2) a silicone elastomer cured product according to any one of [1] to [9] laminated on the substrate, and
(L3) a sheet-like member laminated on the silicone elastomer cured product via an adhesive layer or pressure-sensitive adhesive layer; and
separating the silicone elastomer cured product along with the sheet-like member and adhesive layer or pressure-sensitive adhesive layer from (L1) the substrate.

[16] A method for manufacturing an electronic component according to [15], wherein the (L1) substrate is an electronic component or precursor thereof, and the method comprises:
(I) a step of chemically or physically treating the laminate;
(II) a step of subjecting the silicone elastomer cured product and adhesive layer or pressure-sensitive adhesive layer to a radical reaction after step (I); and
(III) removing the silicone elastomer cured product along with the sheet-like member and the adhesive layer or pressure-sensitive adhesive layer from (L1) the substrate after step (II).
[17] A method for manufacturing an electronic component according to [15] or [16], wherein the method further comprises a step of cutting the substrate and the silicone elastomer cured product as a single unit before or after the radical reaction.
[18] A member used to manufacture an electronic component, the member having a silicone elastomer cured product according to any one of [1] to [9].

Effects of the Invention

The present invention is able to provide a silicone elastomer cured product having excellent heat resistance and physical strength, and exhibiting a low modulus of elasticity, low stress, good stress buffering and flexibility, and good adhesion and conformity to a substrate so as not to separate from a substrate even when the cured product is cut together with the substrate while remaining easily removable from the substrate when desired, to provide an application for this silicone elastomer cured product, to provide a method for manufacturing an electronic component using this silicone elastomer cured product, and to provide a member for manufacturing an electronic component.

BRIEF DESCRIPTION OF THE DRAWINGS

FIG. 1 is an optical micrograph showing the top surface of a substrate that has been diced along with the silicone elastomer cured product in Example 4 (no peeling of the silicone layer: evaluation o).

FIG. 2 is an optical micrograph showing the top surface of a substrate that has been diced along with the silicone elastomer cured product in Example 10 (no peeling of the silicone layer: evaluation o).

FIG. 3 is an optical micrograph showing the top surface of a substrate that has been diced along with the silicone gel in Comparative Example 1 (peeling of the silicone layer: evaluation x).

FIG. 4 is an optical micrograph showing the top surface of a substrate that has been diced along with the silicone elastomer cured product in Comparative Example 2 (peeling of the silicone layer: evaluation x).

EMBODIMENT OF THE INVENTION

[Silicone Elastomer Cured Product Having Radical Reactivity]

A silicone gel cured product of the present invention has good flexibility and good adhesiveness and conformability to a substrate because it contains a certain amount of organopolysiloxane resin. Therefore, even when the silicone elastomer cured product has been arranged on top of a substrate and cut together as a single unit, the cured product does not peel off the substrate and the entire surface of the substrate can be protected as desired. Because the surface of the silicone elastomer cured product has radical reactivity, it responds to heat or a high energy radiation and a radical reaction occurs with the adhesive or pressure-sensitive adhesive in contact with the cured product to form a single unit. When a sheet-like member containing an adhesive or pressure-sensitive adhesive is used such as adhesive tape, the cured product and adhesive can be separated (removed) from the substrate as a single unit.

There are no particular restrictions on the shape of the silicone elastomer cured product, but a laminate is preferred. When used in the manufacture of electronic components as described below, a substantially flat silicone elastomer cured product layer is preferred. There are no particular restrictions on the thickness of the silicone elastomer cured product, but the average thickness may be in a range from 5 to 500 μm, in a range from 25 to 300 μm, or in a range from 30 to 200 μm. When the average thickness is less than 5 μm, spaces (gaps) in an uneven substrate surface can be difficult to fill, and the cured product does not function sufficiently as a protective material on an electronic component or precursor during chemical or physical treatment. When the average thickness is greater than 500 μm, the silicone elastomer cured product can be used as a protective material for electronic components in an electronic component manufacturing application, but the amount used is uneconomical.

At least some of the surface of a silicone elastomer cured product of the present invention has radical reactivity derived from an unreacted radical initiator. There are no particular restrictions on the means for arranging the radical initiator on the surface of the silicone elastomer cured product. It may be included in the composition before curing or can be sprayed on the surface of the silicone elastomer cured product after curing. A combination of these means may also be used to realize the desired reactivity. A radical initiator may be used alone or a combination of two or more may be used. The desired radical reactivity can be realized by optimizing reactivity and the radical reaction with the adhesive or pressure-sensitive adhesive making contact with the cured product, the types and amounts of radical initiators included in the composition, the types and amounts of radical initiators applied to the surface of the silicone elastomer cured product after curing, and conditions such as the curing temperature for obtaining the silicone elastomer cured product.

[Radical Initiator]

A radical initiator imparts radical reactivity to a silicone elastomer cured product of the present invention. There are no particular restrictions, but an organic peroxide, photopolymerization initiator, or combination thereof is preferred. Use of alkyl peroxides is especially preferred.

Examples of organic peroxides include alkyl peroxides, diacyl peroxides, peroxide esters, and carbonate peroxides. The ten-hour half-life temperature of these organic peroxides is preferably 70° C. or higher and more preferably 90° C. or higher. By choosing an organic peroxide that reacts selectively at such high temperatures and conducting a curing reaction on the silicone elastomer cured product at a temperature lower than these reaction temperatures, an unreacted radical initiator selectively remains in the cured product.

Examples of alkyl peroxides include dicumyl peroxide, di-tert-butyl peroxide, di-tert-butylcumyl peroxide, 2,5-dimethyl-2,5-di (tert-butylperoxy) hexane, 2,5-dimethyl-2,5-di (tert-butylperoxy) hexyne-3, tert-butylcumyl, 1,3-bis (tert-butylperoxyisopropyl) benzene, and 3,6,9-triethyl-3,6,9-trimethyl-1,4,7-triperoxonane.

Examples of diacyl peroxides include benzoyl peroxides such as p-methylbenzoyl peroxide, lauroyl peroxides, and decanoyl peroxides.

Examples of peroxide esters include 1,1,3,3-tetramethylbutyl peroxy neodecanoate, α-cumyl peroxy neodecanoate, tert-butyl peroxy neodecanoate, tert-butyl peroxy neoheptanoate, tert-butyl peroxypivalate, tert-hexyl peroxypivalate, 1,1,3,3-tetramethylbutylperoxy-2-ethylhexanoate, tert-amyl peroxyl-2-ethylhexanoate, tert-butylperoxy-2-ethylhexanoate, tert-butyl peroxyisobutyrate, di-tert-butylperoxyhexahydroterephthalate, tert-amyl peroxy-3,5,5-trimethylhexanoate, tert-butyl peroxy-3,5,5-trimethylhexanoate, tert-butyl peroxyacetate, tert-butyl peroxybenzoate, and di-butyl peroxytrimethyl adipate.

Examples of carbonate peroxides include di-3-methoxybutyl peroxydicarbonate, di (2-ethylhexyl) peroxydicarbonate, diisopropyl peroxycarbonate, tert-butyl peroxyisopropyl carbonate, di (4-tert-butylcyclohexyl) peroxydicarbonate, diacetyl peroxydicarbonate, and dimyristyl peroxydicarbonate.

The ten-hour half-life temperature of these organic peroxides is preferably 70° C. or higher, more preferably 90° C. or higher, and even more preferably 95° C. or higher. Examples of organic peroxides include p-methylbenzoyl peroxide, dicumyl peroxide, di-t-butyl peroxide, di-t-hexyl peroxide, t-butylcumyl peroxide, 2,5-dimethyl-2,5-di (tertbutylperoxy) hexane, 1,3-bis (tert-butylperoxyisopropyl) benzene, di-(2-t-butylperoxyisopropyl) benzene, and 3,6,9-triethyl-3,6,9-trimethyl-1,4,7-triperoxonane.

There are no particular restrictions on the amount of organic peroxide. However, when compounded in a composition prior to curing, the amount is preferably in a range from 0.05 to 10 parts by mass or in a range from 0.10 to 5.0 parts by mass per 100 parts by mass of the total silicone elastomer cured product. The amount can be selected based on the radical reactivity of the target silicone elastomer cured product.

Photopolymerization initiators generate radicals when exposed to high energy radiation such as ultraviolet light or an electron beam. Examples include acetophenone and derivatives thereof such as acetophenone, dichloroacetophenone, trichloroacetophenone, tert-butyltrichloroacetophenone, 2,2-diethoxyacetophenone and p-dimethylaminoacetophenone; benzoin and derivatives thereof such as benzoin, benzoin methyl ether, benzoin ethyl ether, benzoin butyl ether and benzoin n-butyl ether; benzophenone and derivatives thereof such as benzophenone, 2-chlorobenzophenone, p,p'-dichlorobenzophenone, and p,p'-bisdiethylaminobenzophenone; and others such as p-dimethylaminopropiophenone, Michler's ketone, benzyl, benzyl dimethyl ketal, tetramethylthiuram monosulfide, thioxanthone, 2-chlorothioxanthone, 2-methylthioxanthone, azoisobutyronitrile, benzoin peroxide, di-tert-butyl peroxide, 1-hydroxycyclohexyl phenyl ketone, 2-hydroxy-2-methyl-1-phenyl-propan-1-one, 1-(4-isopropylphenyl)-2-hydroxy-2-methylpropan-1-one, methylbenzoylformate, diphenyl sulfide, anthracene, 1-chloroanthraquinone, diphenyl disulfide, diacetyl, hexachlorobutadiene, pentachlorobutadiene, octachlorobutadiene, and 1-chloromethylnaphthalene. Acetophenone, benzoin, benzophenone, and derivatives thereof are preferred.

There are no particular restrictions on the amount of photopolymerization initiator. However, when compounded in a composition prior to curing, the amount is preferably in a range from 0.05 to 10 parts by mass or in a range from 0.10 to 5.0 parts by mass per 100 parts by mass of the silicone elastomer cured product. The amount can be selected based on the radical reactivity of the target silicone elastomer cured product.

When a photopolymerization initiator is used as the radical initiator in a silicone elastomer cured product of the present invention, the silicone elastomer cured product may contain as an optional component a photosensitizer such as n-butylamine, di-n-butylamine, tri-n-butylphosphine, allylthiourea, s-benzylisothiuronium-p-toluenesulfinate, triethylamine, and diethylaminoethyl methacrylate.

[Physical Properties of the Silicone Elastomer Cured Product]

Because a silicone elastomer cured product of the present invention contains an organopolysiloxane resin in an amount from 10 to 1000 parts by mass per 100 parts by mass of the primary chain organopolysiloxane, the surface has adhesive strength and exhibits adhesion and conformability to a substrate. As a result, the silicone elastomer cured product is less likely to peel off or come off the substrate and continues to adhere to the substrate even when the silicone elastomer cured product has been arranged on a substrate such as an electronic component and is cut off (diced) together with the substrate as a single unit. Because the cured product does not peel off at the edges, the entire substrate can be reliably covered with the cured product to provide protection and the cured product can be used effectively as a protective material on substrates such as an electronic component.

From the standpoint of flexibility, a low elastic modulus, low stress, and stress buffering properties required of protective materials for substrates such as electronic components, the silicone elastomer cured product of the present invention preferably has a loss factor tan δ (measured at a frequency of 0.1 Hz using a viscoelasticity measuring instrument) at a temperature from 23° C. to 100° C. in a range from 0.01 to 1.00, and more preferably at a temperature of 23° C. in a range from 0.03 to 0.95 or in a range from 0.10 to 0.90. When the silicone elastomer cured product is to be cut along with the substrate as a single unit, the cured product preferably has a loss factor tan δ at a temperature from 23° C. to 100° C. in a range from 0.01 to 0.50, and more preferably at a temperature of 23° C. in a range from 0.02 to 0.50.

The storage modulus G' of the silicone elastomer cured product at a temperature from 23° C. to 100° C. is preferably in a range from $4.0 \times 10^4$ to $5.0 \times 10^6$ Pa, more preferably in a range from $4.0 \times 10^4$ to $2.0 \times 10^6$ Pa, and even more preferably in a range from $4.0 \times 10^4$ to $1.0 \times 10^6$ Pa. Because the high adhesion derived from the organopolysiloxane resin that is the adhesion/temporary adhesion-imparting component is also present in an elastic material, when used as a protective material for a substrate such as an electronic component, a silicone elastomer cured product of the present invention is less likely to be physically damaged when cut with the substrate as a single unit and continues to adhere to the substrate as desired as a protective material after the cutting process has been continued.

[Composition Used to Form the Silicone Elastomer Cured Product]

The present invention is a silicone elastomer cured product obtained by curing a composition comprising:

(A) a chain organopolysiloxane having at least two curing reactive groups in the molecule, and optionally (B) an organohydrogenpolysiloxane, (C1) a curing agent for component (A) and component (B) above, and (D) an organopolysiloxane resin in an amount of 10 to 1000 parts by mass per 100 parts by mass component (A). The cured product has radical reactivity derived from an unreacted radical initiator because (C2) a radical initiator is contained in the cured product or applied to the surface of the cured product. Component (B) is a required component when the curing reactive group in component (A) is an organic group containing a carbon-carbon double bond such as an alkenyl group and component (C) is a hydrosilylation reaction catalyst. However, it is not required when another curing mechanism is used.

There are no particular restrictions on the curing mechanism of the curable silicone composition used to form a cured silicone elastomer of the present invention. Examples include a hydrosilylation reaction curing mechanism using an alkenyl group and silicon-bonded hydrogen atom; a dehydration condensation curing mechanism or dealcoholization condensation curable mechanism using a silanol group and/or silicon-bonded alkoxy group; a peroxide curing reaction mechanism by using an organic peroxide; a radical reaction curing mechanism using exposure of, for example, a mercapto group to high energy radiation; or a hydrosilylation reaction curing mechanism using exposure of, for example, a photoactive platinum complex curing catalyst to high energy radiation. When curing is performed by a radical reaction using an organic peroxide, either a large amount of unreacted radical initiator has to be compounded in order to maintain the radical reactivity of the silicone elastomer cured product after curing or a radical initiator has to be applied to the resulting silicone elastomer cured product. Therefore, the curing reaction used to form the silicone elastomer cured product preferably uses a hydrosilylation reaction curing mechanism.

[Component (A) and the Curing Reactive Group]

Component (A) is a chain organopolysiloxane having at least two curing reactive groups in the molecule. Examples include linear organopolysiloxanes or branched organopolysiloxanes and cyclic organopolysiloxanes having no more than two $RSiO_{3/2}$ units (T units) (where each R is independently a monovalent organic group or hydroxyl group), or a $SiO_{4/2}$ unit (Q unit). A linear organopolysiloxane having at least two curing reactive groups in the molecule is preferred. Component (A) may be oily or a raw rubber at room temperature, and the viscosity of component (A) at 25° C. is preferably 50 mPa·s or higher and more preferably 100 mPa·s or higher. When the curable silicone composition is a solvent-type composition, component (A) is preferably a raw rubber having plasticity or a viscosity at 25° C. of at least 100,000 mPa·s. However, a lower viscosity component (A) can be used.

When the curing reaction is a hydrosilylation curing reaction, the curing reactive groups in component (A) include at least an alkenyl group, preferably an alkenyl group having from 2 to 10 carbon atoms. Examples of alkenyl groups having from 2 to 10 carbon atoms include a vinyl group, allyl group, butenyl group, and hexenyl group. The alkenyl group having from 2 to 10 carbon atoms is preferably a vinyl group.

When the curing reaction is a hydrosilylation curing reaction, the curable silicone composition of the present invention preferably contains (B) an organohydrogen polysiloxane as a crosslinking agent, more preferably an organohydrogenpolysiloxane with two or more Si—H bonds in the molecule. In this case, the alkenyl groups in the organopolysiloxane undergo a hydrosilylation reaction with the silicon-bonded hydrogen atoms in the organohydrogenpolysiloxane to form a cured silicone elastomer. Here, component (C1) has to be a hydrosilylation reaction catalyst.

When the curing reaction is a condensation reaction (dehydration condensation reaction or dealcoholization condensation reaction), the curing reactive group in component (A) is a silanol group (Si—OH) or silicon-bonded alkoxy group, and the alkoxy group is preferably an alkoxy group having from 1 to 10 carbon atoms such as a methoxy group, an ethoxy group or a propoxy group. The alkoxy group may be bonded to a side chain or to the end of the organopolysiloxane, and is preferably in the form of an alkylalkoxysilyl group or an alkoxysilyl group-containing group bonded to a silicon atom via another functional group. An organopolysiloxane with this curing reactive group may also have a curing reactive group using another curing mechanism in the same molecule, such as a functional group using a dehydration condensation reaction curing mechanism or dealcoholization condensation reaction curing mechanism. For example, a hydrosilylation reactive functional group or a photopolymerizable functional group may be present in the same molecule as a silicon-bonded alkoxy group or a silanol group.

When a silicon atom-bonded alkoxy group is selected as the curing reactive group for component (A), the curing reactive group is preferably a silicon-bonded alkoxysilyl group represented by the following formula.

[Formula 1]

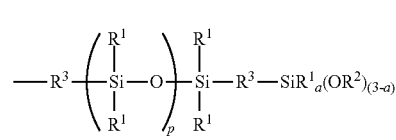

In this formula, each $R^1$ is the same or different monovalent hydrocarbon groups without an aliphatic unsaturated bond, preferably a methyl group or phenyl group. $R^2$ is an alkyl group, preferably a methyl group, an ethyl group, or a propyl group for constituting a dealcoholization condensation reactive alkoxy group. $R^3$ is an alkylene group bonded to a silicon atom, preferably an alkylene group having from 2 to 8 carbon atoms. Here, a is an integer from 0 to 2, and p is an integer from 1 to 50. From the standpoint of dealcoholization condensation reactivity, a is preferably 0 for a trialkoxysilyl group-containing group. The molecule may contain a hydrosilylation reactive functional group or photopolymerizable functional group in addition to this alkoxysilyl group-containing group.

When the curing reaction is a peroxide curing reaction, the curing reactive group for component (A) can be any functional group that is radically reactive with peroxide. There are no particular restrictions on the functional group that is reactive with peroxide, which can be an alkyl group, alkenyl group, acrylic group, or hydroxyl group. However, because the object of the present invention is to obtain a cured silicone elastomer having radical reactivity, when an excessive amount of peroxide is included for the crosslinking reaction with component (A) or a radical initiator has not been separately applied to the silicone elastomer cured product after curing, the cured silicone elastomer obtained from this curing mechanism may not have radical reactivity.

When the curing reaction is a radical reaction curing reaction using exposure to high energy radiation, the curing reactive functional group for component (A) is a photopolymerizable functional group, for example, a mercaptoalkyl group such as a 3-mercaptopropyl group, one of the alkenyl groups listed above, or an acrylamide group such as an N-methylacrylamidopropyl group. There are no particular restrictions on the high energy radiation exposure conditions. For example, the composition may be exposed while remaining at room temperature, while cooling or while heating to 50-150° C. in air, in an inert gas such as nitrogen gas, argon gas or helium gas, or in a vacuum. However, exposure in air at room temperature is preferred. Because some photopolymerizable functional groups experience poor curing while in contact with air, the surface of the curable silicone composition may be covered with a synthetic resin film permeable by high energy radiation during exposure to high energy radiation. Here, a curable silicone composition may be cured at room temperature using ultraviolet light having a wavelength from 280 to 450 nm, preferably from 350 to 400 nm, to obtain a cured silicone elastomer.

In the present invention, component (A) is preferably a linear or branched organopolysiloxane having at least two alkenyl groups in the molecule. Examples include a dimethylsiloxane/methylvinylsiloxane copolymer capped at both ends of the molecular chain with a trimethylsiloxy group, a dimethylsiloxane/methylvinylsiloxane/methylphenylsiloxane copolymer capped at both ends of the molecular chain with a trimethylsiloxy group, dimethylpolysiloxane capped at both ends of the molecular chain with a dimethylvinylsiloxy group, methylphenylpolysiloxane capped at both ends of the molecular chain with a dimethylvinylsiloxy group, a dimethyl siloxane/methyl vinyl siloxane copolymer capped at both ends of the molecular chain with a dimethyl vinyl siloxy group, a dimethylsiloxane/methylvinylsiloxane copolymer capped at both ends of the molecular chain with a dimethylphenylsiloxy group, and dimethylpolysiloxane capped at both ends of the molecular chain with a methylvinylphenylsiloxy group.

[Component (B)]

As mentioned above, component (B) is a crosslinking agent that is required when the curing reaction for the curable silicone composition is a hydrosilylation curing reaction and the curing reactive group in component (A) is an alkenyl group, and is an organohydrogenpolysiloxane, in particular, an organohydrogenpolysiloxane having at least two silicon-bonded hydrogen atoms in the molecule. Component (B) is an optional component when a silicone elastomer cured product of the present invention is obtained using another curing reaction.

Preferred examples of component (B) include dimethyl polysiloxane capped at both ends of the molecular chain with a dimethyl hydrogensiloxy group, methylphenyl polysiloxane capped at both ends of the molecular chain with a dimethyl hydrogensiloxy group, a dimethylsiloxane/methylphenylsiloxane copolymer capped at both ends of the molecular chain with a dimethyl hydrogensiloxy group, diphenyl polysiloxane capped at both ends of the molecular chain with a dimethyl hydrogensiloxy group, methyl hydrogen polysiloxane capped at both ends of the molecular chain with a trimethylsiloxy group, a methyl hydrogen siloxane/dimethyl siloxane copolymer capped at both ends of the molecular chain with a trimethylsiloxy group, a methyl hydrogen siloxane/dimethyl siloxane copolymer capped at both ends of the molecular chain with a dimethyl hydrogensiloxy group, and mixtures of two or more of these organopolysiloxanes. In the present invention, a good example of component (B) is a methyl hydrogen siloxane/dimethyl siloxane copolymer capped at both ends of the molecular chain with a trimethylsiloxy group having a viscosity at 25° C. of 1 to 500 mPa·s. Component (B) may also be a resinous organohydrogenpolysiloxane resin.

When component (A) can be cured alone, the amount of component (B) included can be 0 parts by mass. However, a certain amount is required to cure component (A) in an elastomeric state, when the curing reaction for the curable silicone composition is a hydrosilylation curing reaction and the curing reactive group in component (A) is an alkenyl group. Specifically, the amount of silicon-bonded hydrogen atoms in component (B) is in a range of 0.5 mol or higher, preferably from 0.5 to 5.0 mol, and more preferably from 0.5 to 2.0 mol, per mol of alkenyl groups in component (A) of the composition. Including an excessive amount of component (B) is not preferable as unreacted silicon-bonded hydrogen atoms may cause the production of hydrogen gas.

[Component (C1)]

Component (C1) is a curing agent for component (A) and component (B), and is selected based on the curing reaction group in component (A) and the curing reaction mechanism for the curable silicone composition. A radical initiator such as a peroxide can be used as component (C1).

However, because the object of the present invention is to obtain a cured silicone elastomer having radical reactivity, when an excessive amount of peroxide is included for the crosslinking reaction with component (A) and component (B) or a radical initiator has not been separately applied to the silicone elastomer cured product after curing, a radical initiator is preferably not used as component (C1).

Component (C1) is preferably at least one curing reaction catalyst selected from among hydrosilylation reaction catalysts and condensation reaction catalysts, and the use of a hydrosilylation reaction catalyst is especially preferred. When a radical initiator is used as component (C1), specific examples include the compounds listed above.

The hydrosilylation reaction catalyst can be a platinum-based catalyst, a rhodium-based catalyst, and a palladium-based catalyst. A platinum-based catalyst is especially preferred because it promotes curing of the present composition to a remarkable degree. Examples of platinum-based catalysts include platinum fine powder, chloroplatinic acid, alcohol solutions of chloroplatinic acid, platinum-alkenylsiloxane complexes, platinum-olefin complexes, platinum-carbonyl complexes, and any of these platinum-based catalysts dispersed or encapsulated in a thermoplastic resin such as a silicone resin, polycarbonate resin, or acrylic resin. A platinum-alkenylsiloxane complex is especially preferred. Examples of alkenylsiloxane include 1,3-divinyl-1,1,3,3-tetramethyldisiloxane, 1,3,5,7-tetramethyl-1,3,5,7-tetravinylcyclotetrasiloxane, alkenyl siloxanes in which some of the methyl groups in the alkenyl siloxane have been substituted with, for example, ethyl groups or phenyl groups, and alkenyl siloxanes in which some of the vinyl groups in the alkenyl siloxane have been substituted with, for example, allyl groups or hexenyl groups. In particular, 1,3-divinyl-1,1,3,3-tetramethyldisiloxane is preferred because this platinum-alkenylsiloxane complex has good stability. A non-platinum-based metal catalyst such as an iron, ruthenium, or iron/cobalt catalyst may be used to promote the hydrosilylation reaction.

A granular platinum-containing hydrosilylation reaction catalyst dispersed or encapsulated in a thermoplastic resin may also be used in a silicone elastomer cured product of the present invention. Use of an encapsulated curing agent improves handling and workability and the pot life of the composition, improves the storage stability of the curable silicone composition, and allows for temperature control of the curing reaction for the curable silicone composition.

In the present invention, a hydrosilylation reaction catalyst such as a photoactive platinum complex curing catalyst that promotes a hydrosilylation reaction through exposure to high energy radiation such as ultraviolet rays instead of heating may be used. This hydrosilylation reaction catalyst is preferably a β-diketone platinum complex or platinum complex with a cyclic diene compound as a ligand. Specific examples include a trimethyl (acetylacetonato) platinum complex, trimethyl (2,4-pentanedionate) platinum complex, trimethyl (3,5-heptanedionate) platinum complex, trimethyl (methyl acetoacetate) platinum complex, bis (2,4-pentanedionato) platinum complex, bis (2,4-hexanedionato) platinum complex, bis (2,4-heptandionato) platinum complex, bis (3,5-heptanedionato) platinum complex, bis (1-phenyl-1,3-butanedionato) platinum complex, bis (1,3-diphenyl-1,3-propanedionato) platinum complex, (1,5-cyclooctadienyl) dimethylplatinum complex, (1,5-cyclooctadienyl) diphenylplatinum complex, (1,5-cyclooctadienyl) dipropylplatinum complex, (2,5-norboradiene) dimethylplatinum complex, (2,5-norboradiene) diphenylplatinum complex, (cyclopentadienyl) dimethylplatinum complex, (methylcyclopentadienyl) diethylplatinum complex, (trimethylsilylcyclopentadienyl) diphenylplatinum complex, (methylcycloocta-1,5-dienyl) diethyl platinum complex, (cyclopentadienyl) trimethylplatinum complex, (cyclopentadienyl) ethyldimethylplatinum complex, (cyclopentadienyl) acetyldimethylplatinum complex, (methylcyclopentadienyl) trimethylplatinum complex, (methylcyclopentadienyl) trihexyl platinum complex, (trimethylsilylcyclopentadienyl) trimethylplatinum complex, (trimethylsilylcyclopentadienyl) trihexyl platinum complex, (dimethylphenylsilylcyclopentadienyl) triphenylplatinum complex, and (cyclopentadienyl) dimethyltrimethylsilylmethylplatinum complex.

When a curing agent that promotes a hydrosilylation reaction through exposure to high energy radiation is used, the curable silicone composition can be used as a raw material to form a silicone elastomer cured product without a heating operation.

The amount of hydrosilylation reaction catalyst added is preferably an amount such that the metal atoms are within a range from 0.01 to 500 ppm, from 0.01 to 100 ppm, or from 0.01 to 50 ppm by mass per 100 parts by mass silicone elastomer cured product.

When the curable silicone composition is a condensation reaction-curable composition, there are no particular restrictions on the condensation reaction catalyst. Examples include organic tin compounds such as dibutyltin dilaurate, dibutyltin diacetate, tin octenoate, dibutyltin dioctate, and tin laurate; organic titanium compounds such as tetrabutyl titanate, tetrapropyl titanate, and dibutoxybis (ethyl acetoacetate); acidic compounds such as hydrochloric acid, sulfuric acid, and dodecylbenzenesulfonic acid; alkaline compounds such as ammonia and sodium hydroxide; and amine compounds such as 1,8-diazabicyclo [5.4.0] undecene (DBU) and 1,4-diazabicyclo [2.2.2] octane (DABCO). The amount added is within a range from 0.1 to 10.0 parts by mass per 100 parts by mass silicone elastomer cured product.

[Component (C2)]

Component (C2) is one of the radical initiators described above. A combination in which component (C1) is a curing reaction catalyst containing a hydrosilylation reaction catalyst and component (C2) is an alkyl peroxide is especially preferred.

The amount of component (C2) added is a preferably in a range from 0.5 to 5.0 parts by mass or from 0.75 to 3.5 parts by mass per 100 parts by mass silicone elastomer cured product. When the amount of component (C2) in the curable silicone composition is less than the lower limit mentioned above, the surface of the silicone elastomer cured product may have insufficient radical reactivity even when cured without component (C2) experiencing a reaction. When the amount of component (C2) in the curable silicone composition is greater than the upper limit mentioned above, the excess amount of unreacted component (C2) causes an excess amount of radical initiator to remain on the surface of the substrate when the cured product is adhered to a substrate as a protective material and may react on the substrate surface. When the amount of component (C2) in the curable silicone composition is less than the lower limit mentioned above, a radical initiator is preferably applied separately to the surface of the resulting silicone elastomer cured product.

A curable silicone composition containing component (C2) can be cured at 100° C. or less, preferably 80° C. or less, to obtain a silicone elastomer cured product containing unreacted component (C2). When component (C1) is a curing reaction catalyst containing a hydrosilylation reaction catalyst and component (C2) is an alkyl peroxide, curing the composition at this temperature yields a silicone elastomer cured product containing unreacted alkyl peroxide. Because the surface of the silicone elastomer cured product has radical reactivity without the application of a radical initiator on the surface of the cured product, it is especially suitable from a processing standpoint for use as a protective material for electronic components.

When curing a curable silicone composition that does not contain component (C2) to obtain a cured silicone elastomer, a radical initiator must be applied on some or all of the surface of the cured product using an application means common in the art such as spraying. When the radical initiator is applied to the surface of the cured product, the amount of radical initiator applied is in a range from 0.01 to 5.0 parts by mass per 100 parts by mass silicone elastomer cured product.

[Component (D)]

Component (D) is an organopolysiloxane resin used to impart adhesiveness/pressure-sensitive adhesiveness to a silicone elastomer cured product of the present invention and improve adhesiveness and conformability to a substrate. In this way, the silicone elastomer cured product is less likely to peel off or come off the substrate and continues to adhere to the substrate even when the silicone elastomer cured product has been arranged on a substrate such as an electronic component and is cut off together with the substrate as a single unit. Therefore, the entire substrate is covered with the cured product for effective use as a protective material that provides protection during chemical or physical treatment.

More specifically, component (D) is an organopolysiloxane resin with a resinous or reticulated structure comprising any combination of triorganosiloxy units (M units), diorganosiloxy units (D units), monoorganosiloxy units (T units) and siloxy units (Q units), an organopolysiloxane resin consisting of $R_2SiO_{2/2}$ units (D units) and $RSiO_{3/2}$ units (T units) (where each R is independently a monovalent organic group or hydroxyl group), an organopolysiloxane resin consisting solely of T units, or an organopolysiloxane resin consisting of $R_3SiO_{1/2}$ units (M units) and $SiO_{4/2}$ units (Q units) and having at least two curing reactive groups, hydroxyl groups, or hydrolyzable groups in the molecule. Use of an organopolysiloxane resin consisting of $R_3SiO_{1/2}$ units (M units) and $SiO_{4/2}$ units (Q units) is preferred (referred to below as an MQ resin). When a hydroxyl group is present in component (D), it is bonded directly to a silicon atom in a T unit or Q unit in the molecule, and is a group derived from silane used as a raw material or formed as a result of silane hydrolysis. R in each of the siloxy units is a monovalent organic group or a hydroxyl group, and is preferably an alkyl group or an aryl group, and more preferably a methyl group or a phenyl group, from an industrial standpoint. Some of them may be a curing reactive functional group listed above for component (A). It may contain, for example, an alkenyl group such as a vinyl group, or may contain a silicon-bonded hydrogen atom. By using an organopolysiloxane resin containing these curing-reactive functional groups (alkenyl groups and silicon-bonded hydrogen atoms), a composition can be designed in which the storage modulus G' of the cured product is increased significantly after the radical reaction.

Component (D) is preferably an organopolysiloxane resin consisting of a combination of M units and Q units, in which the molar ratio of M units to Q units is in a range from 0.5 to 1.2. From the standpoint of imparting adhesiveness or pressure-sensitive adhesiveness, an organopolysiloxane resin consisting of $(CH_3)_3SiO_{1/2}$ units (trimethylsiloxy units) and $SiO_{4/2}$ units (Q units) in which the molar ratio of trimethylsiloxy units to Q units is in a range from 0.6 to 1.1 is especially preferred.

From the standpoint of imparting adhesiveness or pressure-sensitive adhesiveness to a silicone elastomer cured product, the amount of component (D) added per 100 parts by mass component (A) may be in a range from 10 to 1000 parts by mass, or in a range from 25 to 500 parts by mass, or in a range from 25 to 300 parts by mass. When the amount of component (D) added is less than the lower limit, the conformability and adhesion of the silicone elastomer cured product to a substrate are insufficient, and the silicone elastomer cured product may come off the edges when applied to a substrate and cut as a single unit. As a result, the cured product does not function sufficiently as a protective material. When the amount of component (D) added is greater than the upper limit, the silicone elastomer cured product loses its properties as an elastic material and becomes hard, the flexibility and conformability of the silicone elastomer cured product are insufficient, and cracks and ruptures occur when the cured product is cut.

[Reinforcing Filler]

A silicone elastomer cured product of the present invention preferably also contains a reinforcing filler. A reinforcing filler can improve the mechanical strength of the silicone elastomer and maintain high shape retention and an adequate degree of hardness. Including a reinforcing filler may also improve the surface releasability of the silicone elastomer cured product after the radical reaction. Examples of reinforcing fillers include inorganic fillers such as fumed silica fine powder, precipitated silica fine powder, calcined silica fine powder, fumed titanium dioxide fine powder, quartz fine powder, calcium carbonate fine powder, diatomaceous earth fine powder, aluminum oxide fine powder, aluminum hydroxide fine powder, zinc oxide fine powder, and zinc carbonate fine powder. These inorganic fillers may be surface treated with an organoalkoxysilanes such as methyltrimethoxysilane, organohalosilanes such as trimethylchlorosilane, organosilazanes such as hexamethyldisilazane, and siloxane oligomers such as α,ω-silanol group-capped dimethylsiloxane oligomers, α,ω-silanol group-capped methylphenylsiloxane oligomers, and α,ω-silanol group-capped methylvinylsiloxane oligomers. The amount added per 100 parts by mass of silicone elastomer cured product is in a range from 0.0 to 20.0 parts by mass and preferably in a range from 1.0 to 10.0 parts by mass. Hollow fillers may also be used, but hollow fillers sometimes expand due to heat generated by the radical reaction and the silicone elastomer cured product readily peels off the substrate.

[Other Components: Curing Retardants, Etc.]

These curable silicone compositions and silicone elastomer cured products may contain other components in a range that does not adversely affect the technical effects of the present invention. Examples include curing retardants; adhesiveness imparting agents; non-reactive organopolysiloxanes such as polydimethylsiloxanes or polydimethyl diphenylsiloxanes; phenol, quinone, amine, phosphorus, phosphite, sulfur, or thioether-based antioxidants; light stabilizers such as triazoles or benzophenones; flame retardants such as phosphate esters, halogens, phosphorus, or antimony; one or more antistatic agents such as cationic surfactants, anionic surfactants, or nonionic surfactants; dyes; pigments; thermal conductive fillers; dielectric fillers; electrically conductive fillers; and release components.

These curable silicone compositions may also contain the following in a range that does not adversely affect the object of the present invention: organic solvents such as toluene, xylene, acetone, methyl ethyl ketone, methyl isobutyl ketone, hexane, and heptane; non-crosslinkable diorganopolysiloxanes such as α,ω-trimethylsiloxy group-capped dimethylpolysiloxane, and α,ω-trimethylsiloxy group-capped methylphenylpolysiloxane; flame retardants such as carbon black; antioxidants such as hindered phenolic antioxidants; heat-resistant agents such as iron oxide; plasticizers such as dialkyl siloxane oligomers capped on both ends of the molecular chain by hydroxyl groups; pigments; thixotropic agents; and antifungal agents. These compositions may also contain an organic solvent such as xylene to more readily blend in component (D).

When a hydrosilylation reaction is selected as the curing reaction for the curable silicone composition, a hydrosilylation reaction inhibitor is preferably include as a curing retardant. Specific examples include alkyne alcohols such as 2-methyl-3-butyn-2-ol, 3,5-dimethyl-1-hexyn-3-ol, 2-phenyl-3-butyn-2-ol, and 1-ethynyl-1-cyclohexanol; enyne compounds such as 3-methyl-3-penten-1-yne and 3,5-dimethyl-3-hexen-1-yne; alkenyl group-containing low molecular weight siloxanes such as tetramethyltetravinylcyclotetrasiloxane and tetramethyltetrahexenylcyclotetrasiloxane; and alkynyloxysilanes such as methyl-tris (1,1-dimethylpropynyloxy) silane and vinyl-tris (1,1-dimethylpropynyloxy) silane. There are no particular restrictions on the amount of curing retardant added, but an amount from 10 to 10,000 ppm relative to the mass of the curable silicone composition is preferred.

Organosilicon compounds having at least one alkoxy group bonded to silicon atoms in the molecule are preferred as adhesiveness imparting agents. Examples of these alkoxy groups include a methoxy group, ethoxy group, propoxy group, butoxy group, and methoxyethoxy group. A methoxy group is preferred. Examples of groups other than alkoxy groups bonded to silicon atoms in these organosilicon compounds include halogen-substituted or unsubstituted monovalent hydrocarbon groups such as an alkyl group, alkenyl group, aryl group, aralkyl group, and halogenated alkyl group; glycidoxyalkyl groups such as a 3-glycidoxypropyl group and 4-glycidoxybutyl group; epoxycyclohexylalkyl groups such as a 2-(3,4-epoxycyclohexyl) ethyl group and 3-(3,4-epoxycyclohexyl) propyl group; epoxyalkyl groups such as a 3,4-epoxybutyl group and 7,8-epoxyoctyl group; acrylic group-containing monovalent organic groups such as a 3-methacryloxypropyl group; and a hydrogen atom. These organosilicon compounds preferably have a group reactable with an alkenyl group or silicon-bonded hydrogen atom in the composition. Specifically, a composition having an alkenyl group or silicon-bonded hydrogen atom is preferred. An organosilicon compound having at least one epoxy group-containing monovalent organic group in the molecule is preferred because it imparts good adhesion to various substrates. These organosilicon compounds include organosilane compounds, organosiloxane oligomers, and alkyl silicates. The molecular structure of these organosiloxane oligomers and alkyl silicates can be linear, partially branched linear, branched, cyclic, or reticulated. However, a linear, branched, or reticulated molecular structure is preferred. Examples of organosilicon compounds include silane compounds such as 3-glycidoxypropyltrimethoxysilane, 2-(3,4-epoxycyclohexyl) ethyltrimethoxysilane, and 3-methacryloxypropyltrimethoxysilane; siloxane compounds having at least one silicon-bonded alkenyl group or silicon-bonded hydrogen atom and at least one silicon-bonded alkoxy group in the molecule; a mixture of a silane compound or a siloxane compound having at least one silicon-bonded alkoxy group and a siloxane compound having at least one silicon-bonded hydroxy group and one silicon-bonded alkenyl group in the molecule; methyl polysilicates; ethyl polysilicates; and epoxy group-containing ethyl polysilicates. These adhesiveness imparting agents are preferably low viscosity liquids. There are no particular restrictions on the viscosity, but a viscosity at 25° C. in a range from 1 to 500 mPa·s is preferred. There are no particular restrictions on the amount of adhesiveness imparting agent added, but an amount in a range from 0.01 to 10 parts by mass per 100 parts by mass curable silicone composition is preferred.

There are no particular restrictions on the application method used to form a curable silicone composition producing a silicone elastomer cured product of the present invention on a substrate, and can be any conventional method used to form cured layers. Examples include gravure coating, offset coating, offset gravure coating, roll coating using an offset transfer roll coater, reverse roll coating, air knife coating, curtain coating using a curtain flow coater, comma coating, and a Meyer bar.

When a silicone elastomer cured product of the present invention is obtained without applying a radical initiator after curing, the curable silicone composition is preferably cured at a temperature at which the radical initiator does not react. More specifically, when an alkyl peroxide is selected as the radical initiator, the reaction is performed at a temperature for curing of 100° C. or less, and preferably from room temperature to 90° C. When the curing reaction is a hydrosilylation reaction, the curing is preferably performed at a temperature in a range from 70 to 90° C. for 10 minutes to 3 hours. An alkyl peroxide remains in the silicone elastomer cured product in a substantially unreacted state under these temperature conditions, and the surface of the resulting silicone elastomer cured product has radical reactivity.

[Radical Reaction]

Because an unreacted radical initiator is present in the cured product or on the surface of the cured product, a silicone elastomer cured product of the present invention has radical reactivity with various adhesives and pressure-sensitive adhesives, and a cured product integrated with the adhesive or pressure-sensitive adhesive is formed by the radical reaction. The silicone elastomer cured product and the adhesive or pressure-sensitive adhesive form a strongly bonded unit after the radical reaction and can be peeled off as a single unit.

There are no particular restrictions on the type of adhesive or pressure-sensitive adhesive used. However, in terms of radical reactivity, examples include acrylic resin-based pressure-sensitive adhesives, rubber-based pressure-sensitive adhesives, and silicone-based pressure-sensitive adhesives; and acrylic resin-based adhesives, synthetic rubber-based adhesives, silicone-based adhesives, epoxy resin-based adhesives, and polyurethane-based adhesives. These adhesives or pressure-sensitive adhesives may form an adhesive layer or pressure-sensitive adhesive layer on a sheet-like (or film-like) substrate such as adhesive tape or pressure-sensitive adhesive tape, but are preferably applied on a sheet-like substrate and a silicone elastomer cured product of the present invention.

A radical reaction of the silicone elastomer cured product of the present invention and the adhesive or pressure-sensitive adhesive may include a step in which both are radically reacted with heat at a temperature above 100° C., preferably a temperature above 120° C., and more preferably a temperature above 130° C. A radical reaction may be selected in a temperature range from 120° C. to 200° C. or in a temperature range from 130 to 180° C.

The radical reaction can be advanced by exposure to high energy radiation (also known as activating radiation). Examples of high energy radiation include ultraviolet radiation and electron beam radiation, but ultraviolet radiation is preferred from a practical standpoint. The source of the ultraviolet radiation can be a high pressure mercury lamp, medium pressure mercury lamp, Xe—Hg lamp, or deep UV lamp, and the ultraviolet radiation can be at a wavelength from 280 to 400 nm, preferably from 350 to 400 nm. The amount of radiation is preferably from 100 to 10,000 mJ/cm$^2$. When a radical reaction is performed on the silicone elastomer cured product and the adhesive or pressure-sensitive adhesive, the radical reaction can be performed selectively depending on the temperature conditions, and a combination of radical reactions can also be used.

After the radical reaction, the radically reactive silicone elastomer cured product tends not to experience a significant change in loss factor tan δ (as measured at a frequency of 0.1 Hz using a viscoelasticity measuring instrument).

A radically reactive silicone elastomer cured product can be designed so that the storage modulus G' does not change much after the radical reaction or can be designed so that the storage modulus G' changes significantly after the radical reaction. More specifically, when the radically reactive silicone elastomer cured product contains some or all of component (D), which is an organopolysiloxane resin containing a curing reactive functional group (such as an alkenyl group or silicon-bonded hydrogen atoms), in addition to component (A) etc., the storage elastic modulus G' of the silicone elastomer cured product tends to increase by a factor or 1 to 10 times after the radical reaction, and a radically reactive silicone elastomer cured product can be designed in which the storage modulus G' increases by a factor in a range from 1.1 to 7.0 times. A radically reactive silicone elastomer cured product in which the storage modulus G' increases after the radical reaction has improved durability as a protective material on a substrate such as an electronic component after the radical reaction and is more securely bonded to the surface of, for example, tape. As explained below, this allows the cured product to be readily removed (separated) with the tape as a single unit from the electronic component or other substrate.

[Use as a Protective Material for an Electronic Component]

A silicone elastomer cured product of the present invention can be used as a protective material for electronic components because it has excellent adhesion to substrates, flexibility, a low modulus of elasticity, low stress, and excellent low stress buffering. It also does not peel at the edges when placed on top of a substrate such as an electronic component and cut along with the electronic component. Once it has played its protective role, it can be radically reacted with, for example, adhesive tape to remove the cured product along with the tape as a single unit, and readily separated (and removed) both from the electronic component or other substrate.

[Other Uses]

A silicone elastomer cured product of the present invention can be used as an adhesive, a sealing material, or a bonding material, but is especially suitable for use as a sealant. Applications include architectural materials, electrical/electronic components, and automotive parts. However, a silicone elastomer cured product of the present can be used especially as an adhesive or sealant in the manufacture of electronic components.

[Electronic Component Manufacturing Applications]

A silicone elastomer cured product of the present invention is especially useful in the manufacture of electronic components, and can be used to form a silicone elastomer cured product layer on various substrates to create a stable and flat protecting layer with excellent stress relaxation. The function of such a protective layer is to provide protection against physical impacts due to the strength and elasticity of the silicone elastomer cured product, protection against heat and temperature changes due to the heat resistance and cold resistance of silicone, and protection in various types of chemical or physical treatment of electronic components (including partial applications designed for treatment of a surface). As mentioned above, the protective layer can be easily formed on an electronic component and easily removed.

[Laminates Used in the Production of Electronic Components]

A silicone elastomer cured product of the present invention is specifically useful as a silicone elastomer cured product layer constituting a laminate used in the production of electronic components. The following is an explanation of this laminate.

[Substrates]

The substrate on which a silicone elastomer cured product layer is laminated is preferably not uneven or allows the silicone elastomer cured product to fill and conform to an uneven surface without leaving gaps so that a flat silicone elastomer cured product is formed. Because a silicone elastomer cured product layer of the present invention is flexible and has excellent deformability, conformability, and adhesion, it is less likely to leave gaps on an uneven substrate, and a non-detached silicone elastomer cured product with a non-deformed surface is more likely to be formed. There are no particular restrictions on the purpose for laminating a silicone elastomer cured product surface. When the substrate is an electronic component, the purpose may be to selectively protect the portions covered by the silicone elastomer layer from various treatments, or to protect the portions covered by the silicone elastomer layer from physical vibrations and shocks.

There are no particular restrictions on the substrate used in the present invention. Any substrate may be used, but an electronic component or precursor thereof is preferred. The substrate can be made of a material such as glass, porcelain, mortar, concrete, wood, aluminum, copper, brass, zinc, silver, stainless steel, iron, tin, tinplate, a nickel-plated surface, an epoxy resin, or a phenolic resin. The substrate can also be made of a thermoplastic resin such as a polycarbonate resin, polyester resin, ABS resin, nylon resin, polyvinyl chloride resin, polyphenylene sulfide resin, polyphenylene ether resin, or polybutylene terephthalate resin. It may be a rigid plate or a flexible sheet. The substrate may also be a stretchable film or sheet used as the substrate, for example, in dicing tape.

The substrate used in the present invention may be subjected to a surface treatment such as a primer treatment, corona treatment, etching treatment or plasma treatment in order to improve the adhesion or adhesiveness of the silicone elastomer cured product layer.

When a laminate of the present invention is used in the production of an electronic component, the substrate is preferably an electronic component or precursor thereof. Specific examples include semiconductor elements, pedestals for the temporary arrangement of electronic components during the manufacturing process, semiconductor wafers for lamination, ceramic elements (including ceramic capacitors), and substrates for electronic circuits. These may be separated into individual units by dicing. A substrate that can be used as a semiconductor element, a pedestal for processing electronic components, a circuit board, a semiconductor substrate, or a semiconductor wafer is preferred.

There are no particular restrictions on the materials used in these substrates. Materials preferably used in circuit boards include organic resins such as glass epoxy resins, Bakelite resins and phenol resins, ceramics such as alumina, metals such as copper and aluminum, and silicon wafers for semiconductor applications. When the substrate is an electronic component, especially a semiconductor element or a circuit board, conductive wiring made of copper or silver-palladium may be printed on the surface. A silicone elastomer cured product of the present invention fills and conforms to the uneven surface of semiconductor elements and the surface of a circuit board without leaving gaps to form a silicone elastomer cured product with a flat surface. The surface on which the silicone elastomer cured product has been formed can selectively protect against physical impacts and various treatments.

[Electronic Components]

A laminate of the present invention, as mentioned above, preferably has one or more electronic components as the substrate. There are no particular restrictions on the type of electronic component. Examples include semiconductor wafers used to make semiconductor chips, ceramic elements (including ceramic capacitors), semiconductor chips, and light emitting semiconductor chips. A silicone elastomer layer may be arranged on two or more electronic components that are the same or different. The silicone elastomer layer in the laminate of the present invention can form a stable, flat surface because it has sufficient flexibility and excellent conformability and deformability. Because the silicone elastomer cured product can selectively protect the laminated surface from various treatments and can lessen vibrations and impacts during the electronic component manufacturing process, the electronic components on which the silicone elastomer cured product has been laminated remain securely in their proper place. As a result, electronic component defects due to uneven substrate surfaces, electronic component slippage, and vibrational displacement (damping) are less likely to occur even when various patterns are formed on the electronic components and processing such as dicing is performed. The electronic components are held in place by the silicone elastomer cured product due to the elasticity of the elastomer and the adhesion of the organopolysiloxane resin, and the electronic components are supported both by the adhesive strength and the deformability of the elastomer itself.

[Treatment of Electronic Components]

The electronic components may be subjected to chemical or physical treatment prior to the formation of the laminate or may be subjected to chemical of physical treatment after the silicone elastomer cured product has been laminated on the electronic components. Because the portions of the electronic components on which the silicone elastomer cured product has been laminated can experience selective protection from these treatments, certain portions of the electronic components can be protected from certain kinds of chemical or physical treatment. Because a silicone elastomer of the present invention can be effectively separated as a cured product in various locations in a pinpoint manner, it can be used to selectively protect electronic components. The treatment of electronic components includes the at least partial formation of electronic circuits, electrode patterns, conductive film, and insulating film. However, there are no particular restrictions. These can be performed using any means common in the art without restriction. For example, these components can be formed using the vacuum deposition method, sputtering method, electroplating method, chemical plating method (including electroless plating method), etching method, printing method, or lift-off method. When a laminate of the present invention is used in the manufacture of electronic components, the formation of electronic circuits, electrode patterns, conductive films and insulating films for electronic components is preferably performed after the silicone elastomer cured product has been laminated. The laminate can then be separated into individual units (diced). By using a silicone elastomer cured product layer, electronic component treatment defects can be suppressed. The treatment can be performed above, below, to the left or to the right of the electronic component substrate and silicone elastomer cured product layer.

Because this silicone elastomer cured product can form a cured layer with superior shape retention, hardness, and surface releasability, the cured layer can be easily separated from the electronic component substrate in a laminate with an electronic component substrate. Foreign matter such as residue (adhesive residue) from the cured silicone elastomer is less likely to adhere to the electronic components and fewer defective products are produced. This silicone elastomer cured product can also form a single unit with a sheet substrate and an adhesive layer/pressure-sensitive adhesive layer via a radical reaction, and the cured product can be quickly, easily, and reliably separated.

[Sheet-Like Member]

A sheet-like member at least partially includes an adhesive layer or pressure-sensitive adhesive layer. This may be laminated on top of a curing reactive silicone elastomer cured product via an adhesive layer or pressure-sensitive adhesive layer. Because the silicone elastomer cured product is adhered via an adhesive layer or pressure-sensitive adhesive layer, the sheet-like member and cured product form a single unit when the silicone elastomer cured product is subjected to a radical reaction, and can be separated from the substrate substantially as a single unit. A radical reaction silicone elastomer cured product can experience problems such as disruption and a complicated stripping process, depending on the machinery used in the separation process. However, a radical reaction silicone elastomer cured product integrated with a sheet-like member can be easily separated locally in a pinpoint manner, and can be easily, quickly and reliably separated from the substrate. This can significantly reduce work times and the amount of labor required in an industrial production process.

A sheet-like member with an adhesive layer or pressure-sensitive adhesive layer can be used without restriction as an adhesive/pressure-sensitive adhesive film or as an adhesive/pressure-sensitive adhesive sheet. It can also be used without restriction as a substantially flat substrate in tape or film of any width or thickness required of the desired application. Specific examples of sheet-like substrates include paper, synthetic resin film, cloth, synthetic fibers, metal foil (aluminum foil, copper foil, etc.), glass fibers, and composite sheet-like substrates consisting of a plurality of these. Synthetic resin films are especially preferred. Examples of synthetic resin films include polyester, polytetrafluoroethylene, polyimide, polyphenylene sulfide, polyamide, polycarbonate, polystyrene, polypropylene, polyethylene, polyvinyl chloride, polyvinylidene chloride, polycarbonate, polyethylene terephthalate, and nylon films. There are no particular restrictions on the thickness, which is usually from 5 to 300 μm.

These synthetic resin films may be subjected to surface treatments, including primer treatment, corona treatment, etching treatment, and plasma treatment. These treatments improve the adhesion and integration of the adhesive layer and sheet-like member as described below.

There are no particular restrictions on the type of adhesive layer or pressure-sensitive adhesive layer used on the sheet-like member. Because the purpose is to become integrated with a silicone elastomer cured product using a radical reaction and to separate as a unit, a secure integrated unit is preferably formed so that no cohesive failure of the integrated unit occurs when separated from the substrate.

The adhesive or pressure-sensitive adhesive used in the adhesive layer or pressure-sensitive adhesive layer can be one listed above. The radical reaction is conducted in the manner described above.

[Laminate Production Method]

A laminate of the present invention is obtained by laminating a sheet-like member on a substrate via a silicone elastomer cured product and adhesive layer. If desired, the curable silicone composition serving as the raw material composition of the silicone elastomer cured product can be applied on the target substrate and cured to an elastomer state while maintaining radical reactivity.

A laminate of the present invention can also be produced by forming a silicone elastomer cured product on a sheet-like substrate with the desired release layer, separating the silicone elastomer cured product from the release layer and transferring it to another substrate, and then laminating a sheet-like member via an adhesive layer.

The laminated layer of the silicone elastomer cured product can be applied over the entire substrate or locally to provide substrate protection in a pinpoint manner. If necessary, an unreacted radical initiator can be applied using a means such as a sprayer on the surface of the silicone elastomer cured product. As described below, a substrate on which the silicone elastomer cured product has been laminated may be cut into single units of the laminate.

[Releasable Laminate]

When a radically reactive silicone elastomer cured product is formed on a sheet-like substrate (substrate R) having a release layer and is later separated from the release layer and handled as a sheet-like member, a silicone elastomer cured product layer with a uniform surface may be formed using the following method. The sheet-like substrate (substrate R) having a release layer is substantially flat and can be used without restriction as a substrate of the desired width and thickness depending on the application, such as tape or film. A synthetic resin film (such as PET film) having a thickness from 5 to 30 μm is especially preferred. The release agent used to form the release layer can be a rubber elastomer such as an olefin resin, isoprene resin or butadiene resin, or a long-chain alkyl resin, alkyd resin, fluorine resin or silicone resin. Use of a release agent made of a silicone-based resin is preferred, and use of a release agent containing a fluorine-modified silicone resin having an fluoroalkyl group is especially preferred.

[Production Method for Curing Separators Having a Release Layer]

A silicone elastomer cured product layer of the present invention is preferably substantially flat. When a curable silicone composition is applied on a substrate having a release layer in the usual manner and the thickness of the silicone elastomer cured product layer after curing is to be 50 μm or more, the applied surface is sometimes uneven, resulting in a silicone elastomer cured product layer whose surface is also sometimes uneven. However, a flat silicone elastomer cured product layer can be obtained by applying a substrate with a release layer on a curable silicone composition and cured silicone elastomer cured layer, interposing the uncured coating surface between sheet-like substrates each having a release layer (substrate R; separator) to form a physically flattened layer. In the formation of this flattened layer, the laminate obtained by applying the uncured silicone composition between separators having a release layer is preferably rolled using a known rolling method. In this case, the silicone elastomer cured product layer after curing is preferably interposed between sheet-like substrates having a release layer, and more preferably interposed between two sheet-like substrates having a release layer of a release agent made of silicone resin.

[Electronic Component Production Method]

As mentioned above, a laminate of the present invention is effective in the production of electronic components. By forming a silicone elastomer cured product on an electronic component substrate to form a stable, flat surface having excellent stress relaxation for arranging electronic components, the portions on which the silicone elastomer cured product is laminated can provide selective protection to electronic components from chemical or physical treatments. As a result, electronic component defects due to uneven substrate surfaces, electronic component slippage, and vibrational displacement (damping) are less likely to occur during production of electronic components. By conducting a radical reaction on a silicone elastomer cured product on which a sheet-like member has been laminated via an adhesive layer or pressure-sensitive adhesive layer, a radical reaction product consisting of the sheet-like member, a silicone elastomer cured product, and an adhesive layer or pressure-sensitive adhesive layer can be cut as a single unit. This unit can also be easily, quickly, and reliably separated from the electronic component even when the silicone elastomer cured product has been locally arranged and cured, making effective removal of the cured product more difficult. Defects due to residue (adhesive residue) from the silicone elastomer cured product are also less likely to occur.

More specifically, the method for manufacturing an electronic component in the present invention comprises step (I): a step of forming a laminate having a sheet-like member having an electronic component, a silicone elastomer cured product, and an adhesive layer or pressure-sensitive adhesive layer;

step (II): a step of treating the electronic component to one or more chemical or physical treatments (including but not limited to one or more types of processing selected from among formation of electronic circuits, formation of electrode patterns, formation of conductive films, formation of insulating films) after step (I);

step (III): a step of performing a radical reaction on the silicone elastomer cured product and adhesive layer or pressure-sensitive adhesive layer after step (II); and step (IV): a step of substantially simultaneously separating the integrated sheet-like member, silicone elastomer cured product, and adhesive layer or pressure-sensitive adhesive layer from the electronic component after step (III).

The process of forming the laminate in step (I) can optionally entail applying a curable silicone composition on the electronic component substrate and curing the composition to an elastomer state, or transferring a separately formed silicone elastomer cured product onto the electronic component substrate.

Because the silicone elastomer may be laminated in the sheet-like member after the electronic component has been subjected to chemical or physical treatment, use of the following steps is preferred.

Step (I'): a step of laminating a silicone elastomer cured product on the electronic component;

step (II'): a step of treating the electronic component to one or more chemical or physical treatments (including but not limited to one or more types of processing selected from among formation of electronic circuits, formation of electrode patterns, formation of conductive films, formation of insulating films) after step (I');

step (III'): a step of laminating a sheet-like member having an adhesive layer on the silicone elastomer cured product after step (II');

step (IV'): a step of performing a radical reaction on the silicone elastomer cured product and adhesive layer or pressure-sensitive adhesive layer after step (III'); and step (V'): a step of substantially simultaneously separating the integrated sheet-like member, silicone elastomer cured product, and adhesive layer or pressure-sensitive adhesive layer from the electronic component after step (IV').

[Cutting Step: Dicing]

As explained in the [Laminates Including Electronic Components] section above regarding electronic components, the method for manufacturing an electronic component of the present invention preferably includes the steps of forming electronic circuits, electrode patterns, conductive films, and insulating films on the electronic components after the silicone elastomer cured product has been laminated. The laminate or electronic components may then be cut into individual units (dicing). Because a silicone elastomer cured product of the present invention has excellent conformability and adhesion to a substrate, it is less likely to peel off when cut. Therefore, the step of cutting the substrate and silicone elastomer as a single unit may be included in the manufacturing method for an electronic component before or after the radical reaction.

However, the step of cutting the substrate and silicone elastomer as a single unit by dicing is preferably performed after the silicone elastomer cured product has been laminated on the electronic component (or precursor thereof). In this case, a chemical or physical treatment can be effectively performed over the entire surface of the cut electronic components not covered by the silicone elastomer cured product, and the silicone elastomer cured product and adhesive layer or pressure-sensitive adhesive layer can be separated as a single unit after performing the radical reaction to yield processed and cut electronic products as individual units.

EXAMPLES

The following is a more detailed description of the present invention with reference to examples. However, the present invention is not limited by these examples. The following compounds and compositions are used as raw materials in the examples. In the tables, the amounts for each component are parts by weight.

<Chain Organopolysiloxanes Having Curing Reactive Groups>
Component (A1-1): Dimethyl siloxane polymer capped on both ends with a vinyldimethylsiloxy group (vinyl group content: about 0.13 wt %)
Component (A1-2): Dimethylsiloxane-vinylmethylsiloxane copolymer capped on both ends with a trimethylsiloxy group (vinyl group content: about 0.29 wt %)
Component (A1-3): Dimethyl siloxane polymer capped on both ends with a vinyldimethylsiloxy group (vinyl group content: about 1.53 wt %)
Component (A1-4): Dimethyl siloxane polymer capped on both ends with a vinyldimethylsiloxy group (vinyl group content: about 0.23 wt %)
Component (A1-5):
Dimethyl siloxane polymer capped on both ends with a vinyldimethylsiloxy group (vinyl group content: about 0.45 wt %)

<Organohydrogenpolysiloxanes>
Component (B1): Dimethyl siloxane polymer capped on both ends with a hydrogen dimethylsiloxy group (silicon-bonded hydrogen group content: 0.12 wt %)
Component (B2): Dimethyl siloxane polymer capped on both ends with a hydrogen dimethylsiloxy group (silicon-bonded hydrogen group content: 0.07 wt %)
Component (B3): Dimethylsiloxane-hydrogenmethylsiloxane polymer capped on both ends with a trimethylsiloxy group (silicon-bonded hydrogen group content: 0.78 wt %)

<Curing Agent>
Component (C1): Vinyl siloxane solution of a platinum-divinyltetramethyldisiloxane complex (platinum metal concentration: about 0.6 wt %)

<Radical Initiator>
Component (C2): Mixture of 2,5-dimethyl-2,5-di (t-butylperoxy) hexane and a siloxane polymer capped on both ends with a trimethylsiloxy group (2,5-dimethyl-2,5-di (t-butylperoxy) hexane concentration: about 50 wt %)

<Organopolysiloxane Resin>
Component (D1): Organopolysiloxane resin consisting of trimethylsiloxy units (M units) and $SiO_{4/2}$ units (Q units) with a M unit/Q unit molar ratio of 0.8
Component (D2): Organopolysiloxane resin consisting of trimethylsiloxy units (M units), vinyldimethylsiloxy units ($M^{Vi}$ units) and $SiO_{4/2}$ units (Q units) (vinyl group content: about 4.1 wt %)
Component (D3): Organopolysiloxane resin consisting of hydrogendimethylsiloxy units (M units) and $SiO_{4/2}$ units (Q units) (silicon-bonded hydrogen group content: 0.97 wt %)

<Hydrosilylation Reaction Inhibitor>
Inhibitor: 1,3,5,7-tetramethyl-1,3,5,7-tetravinyl-cyclotetrasiloxane (vinyl group content: about 30.2 wt %)

<Reinforcing Filler>
Silica: Hexamethyldisilazane-treated silica fine particles (surface-treated Aerosil 200V from Nippon Aerosil)

Curable Silicone Compositions: Examples 1-14

The components in the composition described in Table 1 were blended together at the parts by weight mentioned in the table to prepare curable silicone compositions for obtaining the silicone elastomer cured products in Examples 1-14. These were designed so that the amount of silicon-bonded hydrogen atoms (Si—H) in component (B1) was 0.9, 1.2 or 1.3 mol per mol of vinyl groups in the composition.

Curable Silicone Composition: Comparative Example 1

The components in the composition described in Table 2 were blended together at the parts by weight mentioned in the table to prepare a curable silicone composition in Comparative Example 1. This was designed so that the amount of silicon-bonded hydrogen atoms (Si—H) in component (B2) was 0.56 mol per mol of vinyl groups in the composition. The composition in Comparative Example 1 was a composition designed to form a silicone gel and not a silicone elastomer cured product.

Curable Silicone Composition: Comparative Example 2

The components in the composition described in Table 2 were blended together at the parts by weight mentioned in the table to prepare a curable silicone composition in Comparative Example 2 (a composition free of a radical initiator and organopolysiloxane resin). This was designed so that the amount of silicon-bonded hydrogen atoms (Si—H) in component (B1) was 1.20 mol per mol of vinyl groups in the composition.

Preparation of Silicone Elastomer Cured Products: Examples 1-14

The curable silicone compositions prepared above were heated for 1 to 2 hours at 80° C. to conduct a hydrosilylation reaction and obtain elastomeric cured products that were elastic materials. Conditions were selected so that the reaction temperature was lower than the decomposition temperature of the radical initiator in component (C2), and so that most of the radical initiator remained unreacted in the silicone elastomer cured product. Heating was performed at 150° C. for 1 hour in a nitrogen atmosphere to break down the radical initiator and obtain elastomeric cured products.

Preparation of Silicone Gel or Silicone Elastomer Cured Product: Comparative Examples 1-2

The curable silicone compositions prepared above were heated for 1 to 2 hours at 80° C. to conduct a hydrosilylation reaction. In Comparative Example 1, a silicone gel was formed instead of an elastic elastomer cured product. In Comparative Example 2, the hydrosilylation reaction produced an elastomeric cured product that was an elastic material. Conditions were selected so that the reaction temperature was lower than the half-life temperature of the radical initiator in component (C2), and so that most of the radical initiator remained unreacted in the silicone elastomer cured product in Comparative Example 1.

[Measuring the Physical Properties of the Resulting Materials]
1. Measurement of Compression Deformation
First, 18 g of the curable silicone compositions shown in Table 1 or Table 2 were placed in a glass Petri dish (70 mm in diameter). In the examples and comparative examples, the silicone elastomer cured products or silicone gel obtained by performing a hydrosilylation reaction under the conditions described above were used. The measurement was performed at room temperature using a TA.XT Plus texture analyzer (from Eiko Seiki). A flat probe (6 mm in diameter) was lowered at a rate of 0.17 mm per second, and the amount of compressive deformation in the cured product was measured after reaching the maximum compression force of 0.5 N. The values are shown in Table 1 or Table 2.

2. Measurement of Tackiness

Using the samples from the compression deformation measurements, the flat probe in the device was raised at a speed of 0.34 mm per second to a height greater than the initial thickness of the cured product, and the load (absolute value) applied to peel off the flat probe was used as the adhesive force (N). A higher value means the sample had greater adhesive force. The measured values are shown in Table 1 or Table 2.

3. Measurement of Viscoelasticity

Examples 1-14, Comparative Example 2

The curable silicone compositions shown in Table 1 or 2 were placed in a mold to a thickness of about 1.5 mm, and silicone elastomer cured products were obtained by conducting a hydrosilylation reaction under the conditions described above. Test samples with a diameter of 8 mm were cut from the cured products and used as measurement samples. The measurement samples were adhered to a parallel plate with a diameter of 8 mm, and the storage modulus and loss tangent (loss modulus/storage modulus) were measured at a frequency of 1 Hz and a strain of 0.2% using an MCR302 viscoelasticity measurement instrument (from Anton Paar). The values at 23° C. are shown in Table 1 or Table 2.

Comparative Example 1

Because a silicone gel was formed in Comparative Example 1, the measurement was performed at 23° C. in the same manner as Comparative Example 2 except that the strain was set to 0.5%. The value is shown in Table 2.

4. Evaluation of Rubber Properties

The cured products in Example 4 and Example 10 were prepared under the conditions described above. The tear strength, the tensile strength, and elongation at break of the resulting cured products were measured to determine the modulus in accordance with JIS-K6249. The thickness of the sheet used to measure the mechanical strength was 2 mm. The durometer A hardness of Example 8 was measured in the form of a 6 mm thick sheet. The results for Example 4 and Example 8 are shown in Table 3 and Table 4, respectively.

5. Evaluation of Dicing Properties

The curable silicone compositions in Table 1 or Table 2 were coated on a substrate for 15 minutes at 5000 rpm to a thickness of about 10 to 20 μm or a thickness of about 50 μm using a GDE-100 spin coater (from Shimadzu Corporation). Afterwards, a hydrosilylation reaction was conducted under the conditions described above to produce a silicone elastomer cured product layer or a silicone gel layer. The substrate was then diced at a rotational speed of 20,000 rpm and a speed of 30 mm/s using a DAD322 dicer (from DISCO). Afterwards, the surface of the substrate was inspected under an optical microscope (KEYENCE VHX-6000) for peeling of the silicone layer from the substrate. When there was no peeling or hardly any peeling of the silicone layer from the substrate, an o was assigned. When peeling had exposed the substrate, an x was assigned. The evaluations of o or x are shown in the tables. Optical micrographs of Example 4, Example 10, Comparative Example 1 and Comparative Example 2 are shown in FIG. 1, FIG. 2, FIG. 3 and FIG. 4.

6. Adhesion Test to Adhesive Sheet

Primers X and Y (from Dow Corning Toray) were applied on an aluminum substrate to form a thin film. The uncured liquid silicone compositions described in Example 4 and Examples 10-14 were then applied on top to a thickness of about 230 μm, and a hydrosilylation reaction was conducted under the conditions described above to obtain silicone elastomer cured products. Adhesive tape with a silicone-based adhesive layer (No. 336 masking tape with a polyester-based silicone adhesive for heat-resistant plating from Nitto Denko) was applied on top of the elastomer cured products and heated for one hour at 150° C. in a nitrogen atmosphere to conduct a radical reaction with the adhesive layer. After waiting 30 minutes, a 180-degree peel test was performed at 300 mm/min and at 23° C. and 50% relative humidity using a RTC1210 (Orientech). The results are shown in Table 3. In Example 4 and Examples 10-14, the curing reactive elastomer and adhesive tape formed a strong bond (integrated unit) at the interface with strong peel strength.

TABLE 1

| Example No. | 1 | 2 | 3 | 4 | 5 | 6 | 7 |
| --- | --- | --- | --- | --- | --- | --- | --- |
| Component (A1-1) | | | | | | | |
| Component (A1-2) | 62.98 | 56.73 | 52.19 | 50.53 | 46.11 | 41.49 | 40.89 |
| Component (A1-3) | | | | | | | 9.80 |
| Component (A1-4) | | | | | | | |
| Component (A1-5) | | | | | | | |
| Component (B1) | 5.94 | 5.45 | 5.09 | 6.75 | 6.27 | 6.24 | 5.71 |
| Component (B2) | | | | | | | |
| Component (B3) | | | | | | | 0.88 |
| Inhibitor | 0.10 | 0.10 | 0.10 | 0.10 | 0.10 | 0.10 | 0.11 |
| Silica | 6.25 | 6.25 | 6.25 | 6.25 | 6.25 | 6.22 | 6.25 |
| Component (C1) | 0.07 | 0.07 | 0.07 | 0.07 | 0.07 | 0.07 | 0.07 |
| Component (C2) | 2.00 | 2.00 | 2.00 | 2.00 | 2.00 | 1.99 | 2.00 |
| Component (D1) | 22.66 | 29.40 | 34.30 | 34.30 | 39.20 | 43.89 | 34.30 |
| Component (D2) | | | | | | | |
| Component (D3) | | | | | | | |
| SiH/Vi Ratio | 0.9 | 0.9 | 0.9 | 1.2 | 1.2 | 1.3 | 1.2 |
| Compression Rate/% | 1.67 | 2.24 | 2.23 | 1.84 | 2.42 | 3.21 | 1.62 |

TABLE 1-continued

| | 1 | 2 | 3 | 4 | 5 | 6 | 7 |
|---|---|---|---|---|---|---|---|
| Adhesive Strength/N | 0.59 | 0.60 | 0.67 | 0.91 | 1.22 | 1.36 | 0.91 |
| Storage Modulus at 23° C. After Curing at 80° C. (×10$^4$ Pa) | 9.6 | 6.8 | 5.8 | 7.2 | 6.7 | 5.2 | 7.2 |
| Loss Tangent at 23° C. After Curing at 80° C. | 0.03 | 0.05 | 0.07 | 0.06 | 0.11 | 0.25 | 0.12 |
| Storage Modulus at 23° C. After Curing at 150° C. (×10$^4$ Pa) | 11.2 | 9.7 | 7.8 | 9.1 | 8.6 | 8.0 | 9.2 |
| Loss Tangent at 23° C. After Curing at 150° C. | 0.03 | 0.04 | 0.07 | 0.06 | 0.12 | 0.29 | 0.11 |
| Peeling After Dicing | ○ | ○ | ○ | ○ | ○ | ○ | ○ |

| Example No. | 8 | 9 | 10 | 11 | 12 | 13 | 14 |
|---|---|---|---|---|---|---|---|
| Component (A1-1) | | | 28.90 | 26.05 | 22.72 | 19.38 | 12.72 |
| Component (A1-2) | 32.20 | 28.06 | | | | | |
| Component (A1-3) | 18.62 | | | | | | |
| Component (A1-4) | | 17.78 | 17.70 | 21.64 | 26.25 | 30.87 | 40.12 |
| Component (A1-5) | | 7.18 | | | | | |
| Component (B1) | 4.78 | 3.75 | | | | | |
| Component (B2) | | | | | | | |
| Component (B3) | 1.68 | 0.51 | | | | | |
| Inhibitor | 0.11 | 0.11 | 0.11 | 0.11 | 0.11 | 0.11 | 0.11 |
| Silica | 6.25 | 6.25 | 2.12 | 2.12 | 2.12 | 2.12 | 2.12 |
| Component (C1) | 0.07 | 0.07 | 0.07 | 0.07 | 0.07 | 0.07 | 0.07 |
| Component (C2) | 2.00 | 2.00 | 2.04 | 2.04 | 2.04 | 2.04 | 2.04 |
| Component (D1) | 34.30 | 34.30 | 34.28 | 30.00 | 25.00 | 20.00 | 10.00 |
| Component (D2) | | | 11.99 | 14.67 | 17.79 | 20.93 | 27.19 |
| Component (D3) | | | 2.79 | 3.31 | 3.90 | 4.47 | 5.62 |
| SiH/Vi Ratio | 1.2 | 1.2 | 1.2 | 1.2 | 1.2 | 1.2 | 1.2 |
| Compression Rate/% | 1.39 | 2.36 | 1.10 | 1.16 | 1.15 | 1.11 | 0.76 |
| Adhesive Strength/N | 0.95 | 1.01 | 1.77 | 1.39 | 0.93 | 0.74 | 0.31 |
| Storage Modulus at 23° C. After Curing at 80° C. (×10$^4$ Pa) | 6.8 | 6.9 | 25 | 29 | 39 | 67 | 110 |
| Loss Tangent at 23° C. After Curing at 80° C. | 0.13 | 0.10 | 0.27 | 0.26 | 0.25 | 0.25 | 0.21 |
| Storage Modulus at 23° C. After Curing at 150° C. (×10$^4$ Pa) | 8.9 | 8.2 | 112 | 159 | 197 | 260 | 209 |
| Loss Tangent at 23° C. After Curing at 150° C. | 0.11 | 0.09 | 0.30 | 0.25 | 0.19 | 0.16 | 0.11 |
| Peeling After Dicing | ○ | ○ | ○ | ○ | ○ | ○ | ○ |

TABLE 2

| Comparative Example No. | 1 | 2 |
|---|---|---|
| Component (A1-1) | 1.967 | |
| Component (A1-2) | 79.19 | 83.16 |
| Component (A1-3) | | |
| Component (A1-4) | | |
| Component (A1-5) | | |
| Component (B1) | | 10.29 |
| Component (B2) | 9.091 | |
| Component (B3) | | |
| Inhibitor | 0.105 | 0.107 |
| Silica | 6.246 | 6.374 |
| Component (C1) | 0.068 | 0.069 |
| Component (C2) | 2.002 | |
| Component (D1) | | |
| Component (D2) | 1.333 | |
| Component (D3) | | |
| SiH/Vi Ratio | 0.56 | 1.2 |
| Compression Rate/% | 3.27 | 1.32 |
| Adhesive Strength/N | 0.20 | 0.29 |
| Storage Modulus (×10$^4$ Pa, 23° C.) | 2.8 | 12.8 |

TABLE 2-continued

| Comparative Example No. | 1 | 2 |
|---|---|---|
| Loss Tangent (23° C.) | 0.08 | 0.02 |
| Peeling After Dicing | x | x |

TABLE 3

| | Curing Conditions | |
|---|---|---|
| Properties | 80° C. | 80° C. + 150° C. |
| Tensile Strength (MPa) | 0.6 | 0.5 |
| Elongation at Break (%) | 302 | 208 |
| Tear Strength (N/mm) | 1.3 | 1.4 |
| 50% Modulus (MPa) | 0.09 | 0.11 |

TABLE 4

| | Curing Conditions | |
|---|---|---|
| Properties | 80° C. | 80° C. + 150° C. |
| Tensile Strength (MPa) | 3.3 | 3.3 |
| Elongation at Break (%) | 294 | 75 |
| Tear Strength (N/mm) | 2.5 | 1.6 |
| Hardness | 21 | 50 |
| 50% Modulus (MPa) | 0.21 | 1.26 |

TABLE 5

| Example | Example 4 | Example 10 | Example 11 | Example 12 | Example 13 | Example 14 |
|---|---|---|---|---|---|---|
| Peel Strength N/m | 667 | 313 | 375 | 432 | 454 | 517 |

The silicone elastomer cured products in Examples 1-14 have good adhesion to a substrate because of the adhesiveness of the organopolysiloxane resin and the viscoelasticity of an elastomer. Even when cut as a unit with the substrate, the cured products do not peel off during dicing and are able to protect the entire laminated surface. The silicone elastomer cured products tested in Example 4 and Examples 8-12 have radical reactivity with a pressure-sensitive adhesive layer. When a radical reaction is conducted by heating the cured products to 150° C., a strongly integrated unit can be formed which can be removed as a unit from the substrate. Examples 10-14, which all contain an organopolysiloxane resin having a curing reactive functional group as component (D), have a significantly better storage modulus G' after the radical reaction. As a result, improved performance as a protective material and better separation as an integrated unit can be expected.

The silicone gel in Comparative Example 1 and the silicone elastomer cured product in Comparative Example 2 which does not contain an organopolysiloxane resin adhere poorly to a substrate. When both are cut with the substrate as a unit, the edges peel off the substrate (FIG. 3 and FIG. 4). Therefore, they do not function as a protective material in the peeled off portions, and cannot be used as a protective material in applications requiring cutting.

The silicone cured products of the present invention can be evaluated using the following method. A silicone cured product of the present invention is formed on a substrate on which a solder resist has been applied to arrange solder at equal intervals. After dicing using the method described above, tape with the adhesive layer used in the examples is applied to each individual substrate unit and heated to integrate the silicone cured product layer with the tape. When the silicone cured product layer is peeled off the substrate along with the tape and no adhesive remains on the solder surface, the cured product can be used as a protective material.

The cured products can be evaluated as a protective layer using the following method. Metal is sputtered on each of the substrates using an ion coater (IB-3) from Eiko Engineering. After heating, the silicone cured product is peeled off the substrate along with the tape, and it is determined that none of the metal adheres to the surface of the substrate covered by the silicone cured product layer.

The invention claimed is:

1. A silicone elastomer cured product having radical reactivity obtained by curing a composition comprising:
   (A1) a linear or branched organopolysiloxane having at least two alkenyl groups in the molecule;
   (B1) an organohydrogenpolysiloxane having at least two silicon-bonded hydrogen atoms in the molecule, where the amount of silicon-bonded hydrogen atoms in component (B1) is in a range of 0.9 mol or higher per mol of alkenyl groups in component (A1) in the composition;
   (C1) a curing reaction catalyst containing a hydrosilylation reaction catalyst;
   (C2) a radical initiator containing an organic peroxide;
   (D1) an organopolysiloxane resin comprising triorganosiloxy $R_3SiO_{1/2}$ (M) units and siloxy $SiO_{4/2}$ (Q) units in a molar ratio (M/Q) of from 0.5 to 1.2, where R is an alkyl group or aryl group, and component (D1) is present in the composition in an amount of from 10 to 1000 parts by mass per 100 parts by mass component (A1); and
   (E) a reinforcing filler present in the composition in an amount of from 1 to 10 parts by mass per 100 parts by mass of the silicone elastomer cured product;
   wherein unreacted component (C2) is present in the silicone elastomer cured product and/or on the surface of the silicone elastomer cured product, and the cured product has a loss factor tan δ at 0.1 Hz of from 0.01 to 1.00 and a storage modulus G' of from $4.0 \times 10^4$ to $5.0 \times 10^6$ Pa over a temperature range of from 23° C. to 100° C.

2. The silicone elastomer cured product according to claim 1, wherein the surface of the silicone elastomer cured product has radical reactivity with an adhesive or a pressure-sensitive adhesive.

3. The silicone elastomer cured product according to claim 1, wherein component (C2) is an alkyl peroxide.

4. The silicone elastomer cured product according to claim 1, wherein each of components (A1), (B1), (C1), and (D1) are cured at a temperature at which component (C2) does not react.

5. The silicone elastomer cured product according to claim 4, wherein component (C2) is an alkyl peroxide.

6. The silicone elastomer cured product according to claim 1, wherein the silicone elastomer cured product is in the form of a film or sheet having an average thickness of from 5 to 500 μm.

7. The silicone elastomer cured product according to claim 5, wherein the composition is cured at 100° C. or less to obtain the silicone elastomer cured product containing unreacted component (C2).

8. The silicone elastomer cured product according to claim 1, wherein the unreacted component (C2) is present on the surface thereof.

9. The silicone elastomer cured product according to claim 1, wherein the amount of silicon-bonded hydrogen atoms in component (B1) is in a range of 1.2 mol or higher per mol of alkenyl groups in component (A1) in the composition.

10. A laminate comprising the silicone elastomer cured product according to claim 1.

11. A laminate comprising a substrate, the silicone elastomer cured product according to claim 1, and an adhesive layer or a pressure-sensitive adhesive layer, and having a structure in which the silicone elastomer cured product faces the adhesive layer or pressure-sensitive adhesive layer.

12. A laminate comprising a release agent layer facing a surface of the silicone elastomer cured product according to claim 1.

13. A protective material for an electronic component comprising the silicone elastomer cured product according to claim 1.

14. An electronic component comprising the laminate according to claim 10.

15. A method for manufacturing an electronic component comprising:
conducting a radical reaction on the silicone elastomer cured product according to claim 1 and an adhesive layer or pressure-sensitive adhesive layer in a laminate composed of;
(L1) a substrate,
(L2) the silicone elastomer cured product laminated on the substrate (L1), and
(L3) a sheet-like member laminated on the silicone elastomer cured product via the adhesive layer or pressure-sensitive adhesive layer; and
separating the silicone elastomer cured product along with the sheet-like member and the adhesive layer or pressure-sensitive adhesive layer from the substrate (L1).

16. The method for manufacturing an electronic component according to claim 15, wherein the substrate (L1) is an electronic component or precursor thereof, and the method comprises:
(I) chemically or physically treating the laminate;
(II) subjecting the silicone elastomer cured product and the adhesive layer or pressure-sensitive adhesive layer to a radical reaction after step (I); and
(III) removing the silicone elastomer cured product along with the sheet-like member and the adhesive layer or pressure-sensitive adhesive layer from the substrate (L1) after step (II).

17. The method for manufacturing an electronic component according to claim 15, wherein the method further comprises a step of cutting the substrate and the silicone elastomer cured product as a single unit before or after the radical reaction.

18. A member used to manufacture an electronic component, the member having the silicone elastomer cured product according to claim 1.

* * * * *